United States Patent
Gorbachov et al.

(10) Patent No.: US 11,437,992 B2
(45) Date of Patent: Sep. 6, 2022

(54) LOW-LOSS MM-WAVE CMOS RESONANT SWITCH

(71) Applicant: Mobix Labs, Inc., Irvine, CA (US)

(72) Inventors: Oleksandr Gorbachov, Irvine, CA (US); Lisette L. Zhang, Irvine, CA (US)

(73) Assignee: Mobix Labs, Inc., Irvine, CA (US)

( * ) Notice: Subject to any disclaimer, the term of this patent is extended or adjusted under 35 U.S.C. 154(b) by 0 days.

(21) Appl. No.: 17/387,297

(22) Filed: Jul. 28, 2021

(65) Prior Publication Data

US 2022/0038100 A1 Feb. 3, 2022

Related U.S. Application Data

(60) Provisional application No. 63/059,042, filed on Jul. 30, 2020.

(51) Int. Cl.
| | | |
|---|---|---|
| *H04B 1/00* | (2006.01) | |
| *H04B 1/44* | (2006.01) | |
| *H04B 1/46* | (2006.01) | |
| *H04B 1/48* | (2006.01) | |
| *H03K 17/693* | (2006.01) | |
| *H03K 17/687* | (2006.01) | |

(52) U.S. Cl.
CPC ....... *H03K 17/693* (2013.01); *H03K 17/6872* (2013.01); *H03K 2217/0054* (2013.01)

(58) Field of Classification Search
None
See application file for complete search history.

(56) References Cited

U.S. PATENT DOCUMENTS

| | | |
|---|---|---|
| 3,243,529 A | 3/1966 | Behringer |
| 5,717,356 A | 2/1998 | Kohama |
| 6,108,313 A | 8/2000 | Lee et al. |
| 6,414,550 B1 | 7/2002 | Forbes |
| 6,559,703 B1 | 5/2003 | Kwong et al. |
| 6,853,235 B2 | 2/2005 | Nakayama et al. |
| 6,937,845 B2 | 8/2005 | Watanabe et al. |
| 6,977,552 B2 | 12/2005 | Macedo |
| 7,120,399 B2 | 10/2006 | Khorram |
| 7,315,730 B2 | 1/2008 | Galan |
| 7,372,301 B2 | 5/2008 | Fukuoka et al. |
| 7,443,246 B2 | 10/2008 | Andrys et al. |

(Continued)

OTHER PUBLICATIONS

PCT Search Report & Written Opinion for PCT/US21/43738; dated Oct. 26, 2021.

(Continued)

*Primary Examiner* — Kenneth B Wells
(74) *Attorney, Agent, or Firm* — Stetina Brunda Garred & Brucker

(57) ABSTRACT

A resonant switch with a first port and a second port has a capacitor connected thereto. A triple inductor network has a center inductor connected to the first port and the second port, and first and second peripheral inductors each electromagnetically coupled thereto. In a deactivated state, the center inductor and the capacitor define a parallel resonance at a predefined operating frequency range, and in an activated state, insertion loss associated with the center inductor is substantially minimized to metallic trace loss attributable thereto.

20 Claims, 23 Drawing Sheets

(56) References Cited

U.S. PATENT DOCUMENTS

| | | | |
|---|---|---|---|
| 7,446,626 B2 * | 11/2008 | Gorbachov | H03H 7/48 333/112 |
| 7,532,066 B1 | 5/2009 | Struble et al. | |
| 7,710,189 B2 | 5/2010 | Toda | |
| 7,865,149 B2 | 1/2011 | Han et al. | |
| 8,005,504 B2 | 8/2011 | Sano et al. | |
| 8,078,119 B2 | 12/2011 | Gorbachov | |
| 8,103,221 B2 | 1/2012 | Ta et al. | |
| 8,125,226 B2 * | 2/2012 | Wong | G01R 33/341 324/318 |
| 8,135,357 B1 | 3/2012 | Chang et al. | |
| 8,179,648 B1 | 5/2012 | Loeb et al. | |
| 8,260,224 B2 | 9/2012 | Doherty et al. | |
| 8,374,557 B2 | 2/2013 | Gorbachov | |
| 8,854,111 B2 | 10/2014 | Chih-Sheng | |
| 8,907,745 B2 | 12/2014 | Grondahl et al. | |
| 8,928,428 B2 * | 1/2015 | Gorbachov | H01P 5/185 333/112 |
| 8,954,902 B2 | 2/2015 | Stuber et al. | |
| 9,093,734 B2 | 7/2015 | Gorbachov | |
| 9,143,184 B2 | 9/2015 | Gorbachov et al. | |
| 9,148,137 B2 | 9/2015 | Van Wanum | |
| 9,391,657 B2 * | 7/2016 | Iwanaga | H04B 1/0458 |
| 9,450,639 B2 | 9/2016 | Zhang et al. | |
| 9,479,160 B2 * | 10/2016 | Srihari | H03K 17/687 |
| 9,729,190 B2 * | 8/2017 | Yehezkely | H04B 1/0064 |
| 9,749,003 B2 | 8/2017 | Zhao et al. | |
| 9,806,679 B2 | 10/2017 | Gorbachov et al. | |
| 10,097,171 B2 | 10/2018 | Li | |
| 10,536,187 B2 * | 1/2020 | Zhang | H04B 1/006 |
| 10,587,028 B1 * | 3/2020 | Gorbachov | H03H 7/09 |
| 10,608,590 B2 * | 3/2020 | Gorbachov | H03F 1/565 |
| 2004/0141470 A1 | 7/2004 | Kelcourse et al. | |
| 2004/0152426 A1 | 8/2004 | Suzuki et al. | |
| 2004/0209584 A1 | 10/2004 | Bargroff et al. | |
| 2004/0214530 A1 | 10/2004 | Brandt et al. | |
| 2006/0045202 A1 | 3/2006 | Rafi et al. | |
| 2006/0068730 A1 | 3/2006 | Khorram | |
| 2006/0267666 A1 | 11/2006 | Toda | |
| 2007/0213015 A1 | 9/2007 | Nagano et al. | |
| 2007/0222697 A1 | 9/2007 | Caimi et al. | |
| 2007/0232241 A1 | 10/2007 | Carley et al. | |
| 2008/0089252 A1 | 4/2008 | Choi | |
| 2008/0136495 A1 | 6/2008 | Cornelissens et al. | |
| 2008/0159458 A1 | 7/2008 | Cheng et al. | |
| 2008/0218213 A1 | 9/2008 | Kobayashi et al. | |
| 2008/0279262 A1 | 11/2008 | Shanjani | |
| 2009/0029654 A1 | 1/2009 | Fu et al. | |
| 2009/0036065 A1 | 2/2009 | Siu | |
| 2009/0073078 A1 | 3/2009 | Ahn et al. | |
| 2009/0102542 A1 | 4/2009 | Reynolds | |
| 2009/0167627 A1 | 7/2009 | Breiter | |
| 2009/0207764 A1 | 8/2009 | Fukamachi et al. | |
| 2009/0212863 A1 | 8/2009 | Ishimaru | |
| 2009/0298443 A1 | 12/2009 | Ta et al. | |
| 2010/0117727 A1 | 5/2010 | Dawson et al. | |
| 2010/0207679 A1 | 8/2010 | Okashita | |
| 2010/0244981 A1 | 9/2010 | Gorbachov | |
| 2011/0003563 A1 | 1/2011 | Gorbachov | |
| 2011/0221519 A1 | 9/2011 | Katoh et al. | |
| 2012/0163247 A1 | 6/2012 | Shimamoto et al. | |
| 2012/0256702 A1 | 10/2012 | Khlat et al. | |
| 2012/0262217 A1 | 10/2012 | Gorbachov et al. | |
| 2013/0034144 A1 | 2/2013 | Doherty et al. | |
| 2013/0127540 A1 | 5/2013 | Kim et al. | |
| 2013/0307625 A1 | 11/2013 | Hershberger et al. | |
| 2014/0062559 A1 | 3/2014 | Gonzalez et al. | |
| 2014/0062577 A1 | 3/2014 | Chih-Sheng | |
| 2014/0084997 A1 | 3/2014 | Simmonds | |
| 2014/0300424 A1 | 10/2014 | Taghivand | |
| 2015/0207536 A1 | 7/2015 | Yehezkely et al. | |
| 2015/0318852 A1 | 11/2015 | Hoogzaad et al. | |
| 2019/0229679 A1 | 7/2019 | Gorbachov et al. | |
| 2020/0076393 A1 | 3/2020 | Gorbachov et al. | |

OTHER PUBLICATIONS

Search Report and Written Opinion for PCT/US14/37372; dated Oct. 3, 2014; 9 pages.

Madan, Anuj; McPartlin, Michael J.; Zhou, Zhan-Feng; Huang, Chun-Wen Paul; Masse, Christopge; Cressler, John D.; "Fully Integrated Switch-LNA Front-End IC Design in CMOS: A Systematic Approach for WLAN"; IEEE Journal of Solid-State Circuits, vol. 46, No. 11, Nov. 2011.

Gorbachov, Oleksandr; "RF Linear Power Amplifier Gain Stabilization Over Ambient Temperature"; Microwave Journal, Dec. 2005; Horizon House Publications, Inc.

Yoon, Sang-Woong; "Static and Dynamic Error Vector Magnitude Behavior of 2.4-GHz Power Amplifier"; IEEE Transactions on Microwave Theory and Techniques; vol. 55, No. 4, Apr. 2007.

Wei, Wei; Jensen, Ole Kiel; Mikkelsen, Jan H.; "Self-Heating and Memory Effects in RF Power Amplifiers Explained Through Electro-Thermal Modeling"; IEEE; 2013.

Samelis, Apostolos; Whittaker, Edward; Ball, Michael; Bruce, Alasdair; Nisbet, John; Lam, Lui; Vaillancourt, William; "Front-end Modules with Versatile Dynamic EVM Correction for 802.11 Applications in 2GHz Band"; Skyworks Solutions, Inc.; United KingdomZhang, Yichi; Lin, Maoliu; "Evaluation of Envelope-Domain Dynamic X-Parameter Model Based on Variable-Carrier-Frequency Analysis"; Harbin Institute of Technology; China; IEEE, 2012. ; IEEE; 2014.

Zhang, Yichi; Lin, Maoliu; "Evaluation of Envelope-Domain Dynamic X-Parameter Model Based on Variable-Carrier-Frequency Analysis"; Harbin Institute of Technology; China; IEEE, 2012.

Sadeghpour, T.; Karkhaneh, H.; Adb-Alhameed, R. A.; Ghorbani, A.; Noras, J. M.; Excell, P. S.; "Compensation of Transmission Non-Linearity Distortion with Memory Effect for a WLAN802.11a Transmitter"; IET Science Measurement and Technology; vol. 6; Issue 3; 2012.

Roblin, Patrick; Root, David E.; Verspecht, Jan; Ko, Youngseo; Teyssier, Jean Pierre; "New Trends for the Nonlinear Measurement and Modeling of High-Power RF Transistors and Amplifiers with Memory Effects"; IEEE Transactions on Microwave Theory and Techniques, vol. 60., No. 6, Jun. 2012.

Zhang, Yitao; Araki, Kiyomichi; "A Simple Envelope Model for Nonlinear Power Amplifiers with Memory Effects Based on Volterra Expansion"; Proceedings of Asia-Pacific Microwave Conference; 2010.

Ku, Hyunchul; Kenney, J. Stevenson; "Behavioral Modeling of Nonlinear RF Power Amplifiers Considering Memory Effects"; IEEE Transactions on Microwave Theory and Techniques; vol. 51; No. 12; Dec. 2003.

"Receive Signal Decoders" (online article); Aug. 3, 2004, [retrieved on Nov. 5, 2015]; [http://homepages.which.net/paul.hills/Circuits/RxDecoder/RxDecoder.html].

Kundert, K.; "Power Supply Noise Reduction" (online guide); May 11, 2006, [retrieved on Nov. 5, 2015]; [http://www.designers-guide.orge/design/bypassing.pdf].

Delabs; "Non-Inverting Amplifier—Op-Amp Circuits" (blog posting); Mar. 12, 2014, [retrieved on Nov. 5, 2015]/ [http://schematics.dapj.com/2004/10/non-inverting-opamp.html].

PCT Search Report & Written Opinion for International Application No. PCT/US15/49501; dated Dec. 11, 2015.

Gorbachov, Oleksandr; "CMOS WiFi RF Front-Ends for Mobile Handset Applications. Part-1: Preserving WCDMA Receiver Sensitivity" Mar. 2012, 15 pages.

\* cited by examiner

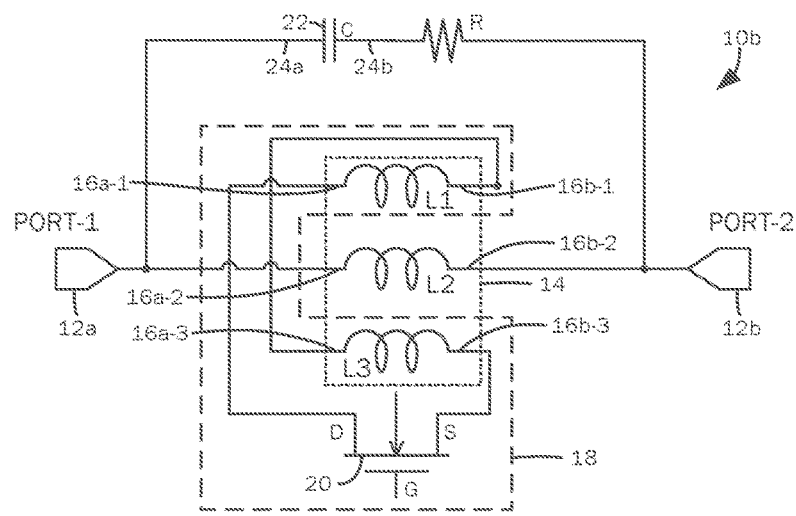
FIG. 11
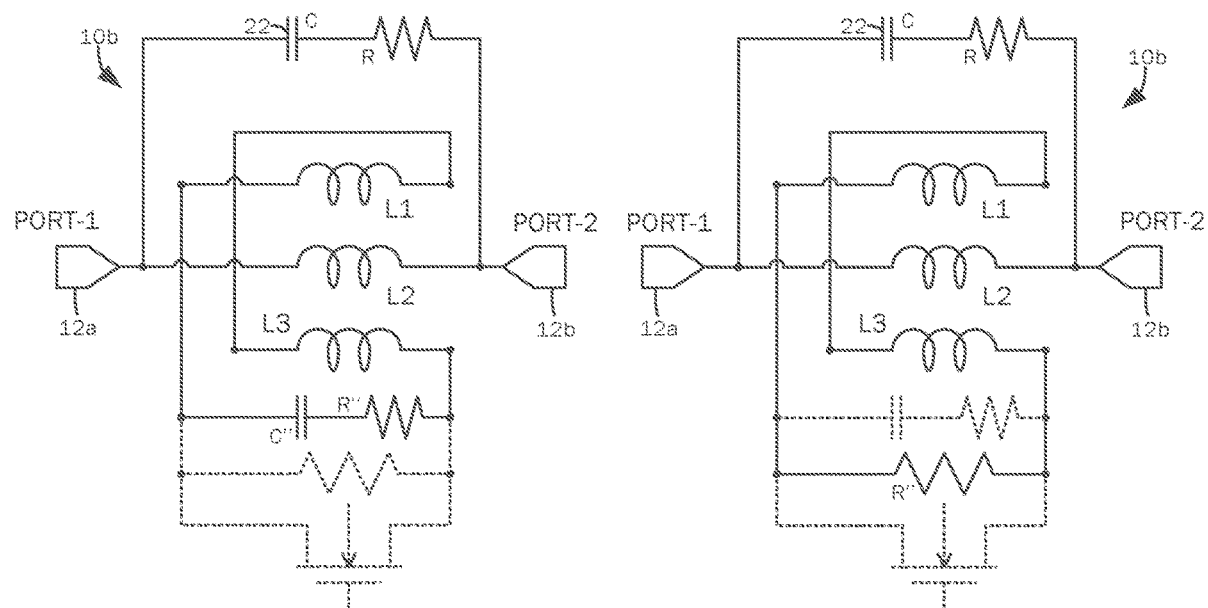
FIG. 12A
FIG. 12B

LOW-LOSS MM-WAVE CMOS RESONANT SWITCH

CROSS-REFERENCE TO RELATED APPLICATIONS

This application relates to and claims the benefit of U.S. Provisional Application No. 63/059,042, filed Jul. 30, 2020 and entitled "LOW-LOSS MM-WAVE CMOS RESONANT SWITCH", the disclosure of which is wholly incorporated by reference in its entirety herein.

STATEMENT RE: FEDERALLY SPONSORED RESEARCH/DEVELOPMENT

Not Applicable

BACKGROUND

1. Technical Field

The present disclosure relates generally to radio frequency (RF) integrated circuits, and more particularly, to low-loss millimeter wave complementary metal oxide semiconductor resonant switches.

2. Related Art

Wireless communications systems find applications in numerous contexts involving information transfer over long and short distances alike, and a wide range of modalities tailored for each need have been developed. Chief among these systems with respect to popularity and deployment is the mobile or cellular phone. Generally, wireless communications utilize a radio frequency carrier signal that is modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System).

Various generations of these technologies exist and are deployed in phases, the latest being the 5G broadband cellular network system. 5G is characterized by significant improvements in data transfer speeds resulting from greater bandwidth that is possible because of higher operating frequencies compared to 4G and earlier standards. The air interfaces for 5G networks are comprised of two frequency bands, frequency range 1 (FR1), the operating frequency of which being below 6 GHz with a maximum channel bandwidth of 100 MHz, and frequency range 2 (FR2), the operating frequency of which being above 24 GHz with a channel bandwidth between 50 MHz and 400 MHz. The latter is commonly referred to as millimeter wave (mmWave) frequency range. Although the higher operating frequency bands, and mmWave/FR2 in particular, offer the highest data transfer speeds, the transmission distance of such signals may be limited. Furthermore, signals at this frequency range may be unable to penetrate solid obstacles. To overcome these limitations while accommodating more connected devices, various improvements in cell site and mobile device architectures have been developed.

The circuitry utilized to implement 5G systems, including RF switches, are understood to exhibit higher losses at the mmWave frequency ranges in comparison to those operating at lower frequencies. This is particularly problematic with integrated on-die components. In a typical single pole, double throw (SP2T) RF resonant switch implemented as Complementary Metal Oxide Semiconductor (CMOS) device, there an inductance is defined across the drain and source terminals. In the off mode, the inductor and the switch capacitance are tuned for parallel resonance, and the signal from the first port to the second port (e.g., from the drain to the source), the signal applied to the first port is substantially attenuated at the second port. In the on mode, the N-channel MOSFET transistor is turned on with low series resistance, hence the signal applied to the first port (e.g., the drain) is attenuated less in comparison to the off mode.

There are several known deficiencies with this configuration, however. When the switch is in the off state, there is a small capacitance that requires a large value inductor for it to be in resonance. A large value inductor, in turn, results in significant series losses and losses associated with shunting to ground. Insertion loss while in the on state is highly dependent on the size of the transistor. A smaller transistor size results in higher series losses but lower losses associated with shunting to ground via lossy substrate. There is understood to be an optimum transistor size in which relatively low insertion loss in the on mode is possible at the same time providing a sufficiently high isolation in the off mode. To a certain extent, the specific semiconductor node choice affects this size optimization. At mmWave frequency ranges, the RF switch loss may be as high as 1 dB to 2 dB, even for small CMOS technology nodes of less than 45 nm.

Accordingly, there is a need in the art for a single pole, single throw (SP1T) RF switch with reduced insertion loss at mmWave frequencies. The SP1T RF switch is a basic element for constructing multi-port RF switches. There is also a need in the art for reducing the losses associated with a mmWave RF switch and is not dependent on the transistor size.

BRIEF SUMMARY

The present disclosure is directed to RF (radio frequency) switches exhibiting minimal insertion losses at mmWave operating frequencies. The switch may be configured such that the metallic trace losses contribute primarily to the insertion loss while activated, and a parallel resonant circuit being present while deactivated. Furthermore, magnetic flux cancellation and consecutive self-inductance minimization is contemplated.

According to one embodiment, there may be a resonant switch with a first port and a second port. The switch may include a center inductor that is electrically connected to the first port and the second port. Additionally, there may be a first peripheral inductor that is electromagnetically coupled to the center inductor, and a first switching transistor network that is electrically connected to the first peripheral inductor. There may also be a second peripheral inductor that is electromagnetically coupled to the center inductor, and a second switching transistor network that electrically connected to the second peripheral inductor. The switch may include a parallel capacitor that is connected to the first port and the second port and may be tuned to resonate with the center inductor at a predefined operating frequency range. The parallel resonant circuit may isolate the first port from the second port with the first switching transistor network and the second switching transistor network being deactivated.

In another embodiment, there may be a resonant switch with a first port and a second port. The switch may include a center inductor that is electrically connected to the first port and the second port. There may also be a first peripheral inductor that is electromagnetically coupled to the center inductor, and a second peripheral inductor that is electromagnetically coupled to the center inductor. The switch may further incorporate a switching transistor that is electrically connected to the first peripheral inductor and the second peripheral inductor. The switch may also include a parallel capacitor that is connected to the first port and the second port and tuned to resonate with the center inductor at a predefined operating frequency range. The parallel resonance is contemplated to isolate the first port from the second port with the switching transistor being deactivated.

According yet another embodiment of the present disclosure, there may be a resonant switch with a first port and a second port. The resonant switch may include a capacitor that is connected to the first port and the second port. There may also be a triple inductor network with a center inductor connected to the first port and the second port, and first and second peripheral inductors each electromagnetically coupled thereto. In a deactivated state, the center inductor and the capacitor define a parallel resonance at a predefined operating frequency range, and in an activated state, insertion loss associated with the center inductor is substantially minimized to metallic trace loss attributable thereto.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings:

FIG. 2A is a schematic diagram showing the equivalent circuit of the first embodiment of the switch shown in FIG. 1 when switched off;

FIG. 2B is a schematic diagram showing the equivalent circuit of the first embodiment of the switch when switched on;

FIG. 4A is a Smith chart plotting the simulated input reflection coefficients (S11) of the first embodiment of the switch with a 2.5 Ohm metallic trace loss associated with each inductor turn and the first set of transistor parameters, when switched on;

FIG. 4B is a graph plotting a sweep of simulated S-parameters over a frequency range for the first embodiment of the switch with a 2.5 Ohm metallic trace loss associated with each inductor turn and the first set of transistor parameters, when switched on;

FIG. 6A is a Smith chart plotting the simulated input reflection coefficients (S11) of the first embodiment of the switch with a 5 Ohm metallic trace loss associated with each inductor turn and the first set of transistor parameters, when switched on;

FIG. 6B is a graph plotting a sweep of simulated S-parameters over a frequency range for the first embodiment of the switch with a 5 Ohm metallic trace loss associated with each inductor turn and the first set of transistor parameters, when switched on;

FIG. 8A is a Smith chart plotting the simulated input reflection coefficients (S11) of the first embodiment of the switch with a 2.5 Ohm metallic trace loss associated with each inductor turn and the second set of transistor parameters, when switched on;

FIG. 8B is a graph plotting a sweep of simulated S-parameters over a frequency range for the first embodiment of the switch with a 2.5 Ohm metallic trace loss associated with each inductor turn and the second set of transistor parameters, when switched on;

FIG. 10A is a Smith chart plotting the simulated input reflection coefficients (S11) of the first embodiment of the switch with a 5 Ohm metallic trace loss associated with each inductor turn and the second set of transistor parameters, when switched on;

FIG. 10B is a graph plotting a sweep of simulated S-parameters over a frequency range for the first embodiment of the switch with a 5 Ohm metallic trace loss associated with each inductor turn and the second set of transistor parameters, when switched on;

FIG. 11 is a schematic diagram of an exemplary low-loss mmWave resonant switch in accordance with a second embodiment of the present disclosure;

FIG. 12A is a schematic diagram showing the equivalent circuit of the second embodiment of the switch shown in FIG. 11 when switched off;

FIG. 12B is a schematic diagram showing the equivalent circuit of the second embodiment of the switch when switched on;

FIG. 14A is a Smith chart plotting the simulated input reflection coefficients (S11) of the second embodiment of the switch with a 2.5 Ohm metallic trace loss associated with each inductor turn and the first set of transistor parameters, when switched on;

FIG. 14B is a graph plotting a sweep of simulated S-parameters over a frequency range for the second embodiment of the switch with a 2.5 Ohm metallic trace loss associated with each inductor turn and the first set of transistor parameters, when switched on;

FIG. 16A is a Smith chart plotting the simulated input reflection coefficients (S11) of the second embodiment of the switch with a 2.5 Ohm metallic trace loss associated with each inductor turn and the third set of transistor parameters, when switched on;

FIG. 16B is a graph plotting a sweep of simulated S-parameters over a frequency range for the second embodiment of the switch with a 2.5 Ohm metallic trace loss associated with each inductor turn and the third set of transistor parameters, when switched on;

FIG. 18A is a Smith chart plotting the simulated input reflection coefficients (S11) of the second embodiment of the switch with a 2.5 Ohm metallic trace loss associated with each inductor turn and the second set of transistor parameters, when switched on;

FIG. 18B is a graph plotting a sweep of simulated S-parameters over a frequency range for the second embodiment of the switch with a 2.5 Ohm metallic trace loss associated with each inductor turn and the second set of transistor parameters, when switched on;

FIG. 20A is a Smith chart plotting the simulated input reflection coefficients (S11) of the second embodiment of the switch with a 5 Ohm metallic trace loss associated with each inductor turn and the second set of transistor parameters, when switched on;

FIG. 20B is a graph plotting a sweep of simulated S-parameters over a frequency range for the second embodiment of the switch with a 5 Ohm metallic trace loss associated with each inductor turn and the second set of transistor parameters, when switched on;

FIG. 22A is a Smith chart plotting the simulated input reflection coefficients (S11) of the second embodiment of the switch with a 5 Ohm metallic trace loss associated with each inductor turn and the first set of transistor parameters, when switched on;

FIG. 22B is a graph plotting a sweep of simulated S-parameters over a frequency range for the second embodiment of the switch with a 5 Ohm metallic trace loss associated with each inductor turn and the first set of transistor parameters, when switched on;

Common reference numerals are used throughout the drawings and the detailed description to indicate the same elements.

DETAILED DESCRIPTION

The detailed description set forth below in connection with the appended drawings is intended as a description of the several presently contemplated embodiments of low-loss millimeter wave (mmWave), complementary metal oxide semiconductor (CMOS) resonant switches. It is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
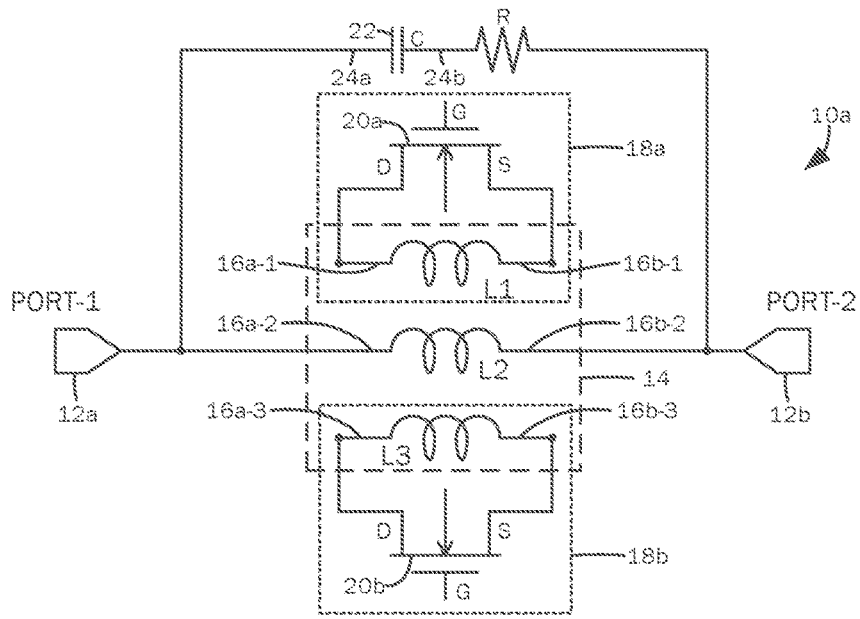
FIG. 1 is a schematic diagram of an exemplary low-loss mmWave resonant switch in accordance with a first embodiment of the present disclosure.

Referring now to the schematic diagram of FIG. 1, a first embodiment of a resonant switch 10a is generally defined by a first port 12a and a second port 12b, to which various other circuit components may be connected. In general, the resonant switch 10 selectively connects those components that are directly connected to the first port 12a, to those components that are directly connected to the second port 12b.

Various embodiments of the resonant switch 10 incorporate a triple inductor network 14, which may be comprised of a center inductor L2, a first peripheral inductor L1, and a second peripheral inductor L3. The center inductor L2 is defined by a first terminal 16a-2 that is electrically connected to the first port 12a, and a second terminal 16b-2 that is electrically connected to the second port 12b. The first peripheral inductor L1 likewise has a first terminal 16a-1 and a second terminal 16b-1, while the second peripheral inductor L2 has a first terminal 16a-3 and a second terminal 16b-3. In one embodiment, the inductors L1, L2, and L3 may be implemented as a series of metallic traces on the semiconductor die and routed to define one or more turns, as will be described in further detail below. Such turns of the inductors L1, L2, and L3 of the triple inductor network 14 are understood to be spaced apart from each other, though are electromagnetically coupled. That is, the first peripheral inductor L1 may be electromagnetically coupled to the center inductor L2, and the second peripheral inductor L3 may be electromagnetically coupled to the center inductor L2. Inductors L1 and L3 are also electromagnetically coupled to each other due to final distance between these inductors but coupling coefficient is typically smaller compared with coupling between either L1 and L2 or L3 and L2.

The peripheral inductors are also understood to be part of transistor switches 18 that are a constituent element of the resonant switch 10. In further detail, there may be a first transistor switch 18a that incorporates the first peripheral inductor L1, and a second transistor switch 18b that incorporates the second peripheral inductor L3. In one embodiment, the first transistor switch 18a has a single transistor 20a, and the second transistor switch 18b similarly has a single transistor 20b. Other embodiments contemplate multiple transistors to handle higher power levels, as will be described in further detail below. In the illustrated first embodiment of the resonant switch 10a, the transistors 20 are contemplated to be field effect transistors that have a gate terminal, a drain terminal, and a source terminal. More specifically, such field effect transistors are understood to be metal oxide semiconductor field effect transistors (MOSFETs). In the illustrated example, the transistors 20 are of the N-type, that is, having an n-type drain and source, and a p-type substrate. This is by way of example only and not of limitation, and P-type transistors may be substituted if desired. Moreover, the specific fabrication technology need not be limited to metal oxide semiconductor, and any other suitable transistor type may be substituted in the transistor switches 18.

In the first transistor switch 18a, the drain terminal of the first transistor 20a is connected to the first terminal 16a-1 of the first peripheral inductor L1, while the source terminal is connected to the second terminal 16b-1 of the same. Similarly, in the second transistor switch 18b, the drain terminal for the second transistor 20b is connected to the first terminal 16a-3 of the second peripheral inductor L3, and the source terminal is connected to the second terminal 16b-3. The gate terminals of each of the first transistor 20a and the second transistor 20b may be connected to a control signal source that can either drive the gate high or low (on or off).

The first embodiment of the resonant switch 10a further includes a capacitor 22 that is connected in parallel to the triple inductor network 14. The capacitor 22 may have a first terminal 24a that is connected to the first port 12a, along with a second terminal 24b that is connected to the second port 12b. The capacitor 22 and the connection to the other segments of the resonant switch 10a may also have an associated parasitic resistance R that is shown in series with the capacitor 22.

The capacitor 22 and the center inductor L3 are understood to define a parallel resonance at a predefined operating frequency range when the resonant switch 10a is in the off or deactivated mode. Such off/deactivated mode is set when both the first transistor switch 18a and the second transistor switch 18b, and specifically the first transistor 20a and the second transistor 20b thereof, are deactivated or turned off. The transistors 20 are so deactivated/turned off when the gate voltage is set low.

Figures 2A, 2B:
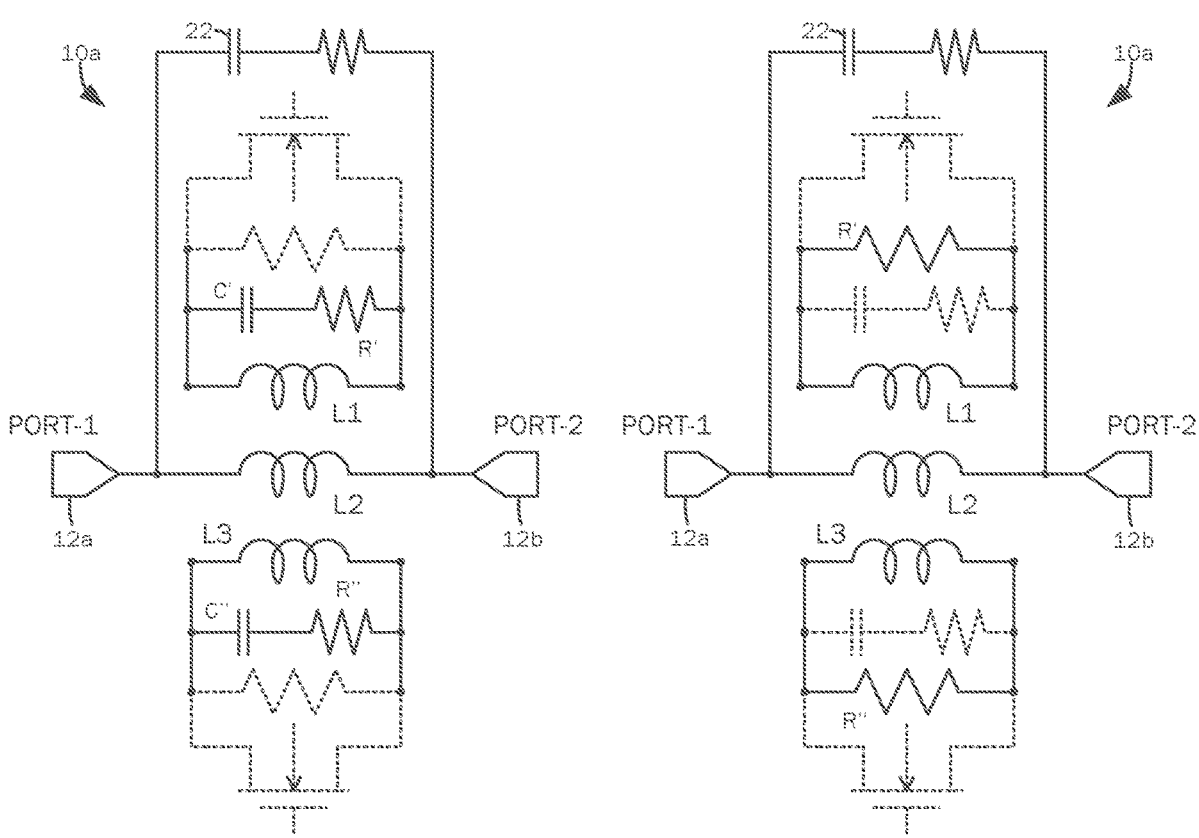

The schematic diagram of FIG. 2A depicts an equivalent circuit of the resonant switch 10a in this state. With the transistors 20 turned off, the nodes of the circuit corresponding to the source and the drain have a high impedance. There is a slight parasitic capacitance C', along with a parasitic resistance R' associated with the first transistor 20a that is in the off or deactivated state. The second transistor 20b is likewise understood to have a slight parasitic capacitance C" and a parasitic resistance R" in the off or deactivated state. According to various embodiments of the present disclosure, the capacitor 22 is tuned to define a parallel resonance with the center inductor L2, which results in a high degree of isolation across the first port 12a and the second port 12b. The aforementioned parasitic capacitances C' and C" may contribute slightly to the overall capacitance with which the center inductor L2 is tuned to resonate, but the contribution is understood to be insignificant. Accordingly, it is contemplated that the value of the components of the resonant switch 10 may span a wide range and is not dependent on the size of the transistors 20. Depending on the needs of the particular application, a different balance between insertion loss and isolation may be achieved by selecting a different resonance resistance. One possible way such a change could be effectuated is by changing the inductances of the triple inductor network 14 and the capacitance values of the parallel capacitor 22 without compromising on the size of the transistors 20.

When the resonant switch 10a is in the on or activated mode, the first transistor switch 18a and the second transistor switch 18b, that is, the first transistor 20a and the second transistor 20b are likewise activated or turned on. The transistors 20 are so activated/turned on when the gate voltage is set high. In this state, the transistors 20 define a low series resistance.

The schematic diagram of FIG. 2B depicts an equivalent circuit of the resonant switch 10a in this state. As shown, there is a resistance R' associated with the first transistor 20a of the first transistor switch 18a and a resistance R" associated with the second transistor 20b of the second transistor switch 18b. It is understood that the resistances R' and R" in FIG. 2A and FIG. 2B have different values. The magnetic flux in the center inductor L2 is understood to be cancelled by the magnetic flux in the opposite direction from the first peripheral inductor L1 and the second peripheral inductor L3, both of which are electromagnetically or inductively coupled to the center inductor L2. Such counteracting magnetic flux is generated as a consequence of the transistors 20 being activated/turned on. Thus, the insertion loss associated with the center inductor L2 may be substantially minimized. Even when the center inductor L2 is configured with a high inductance value, the losses associated therewith may be cancelled by such effect. It is expressly contemplated that the primary or significant contribution to the overall return loss of the resonant switch 10a from the first port 12a to the second port 12b may be limited to that which is associated with the resistive losses from the metallic traces of the center inductor L2.

As will be demonstrated in the simulated performance results of the resonant switch 10a, the self-inductance value of the center inductor L2 may be set to a high value for small semiconductor technology nodes, particularly where copper metal traces are used to achieve low resistive losses. More broadly, the embodiments of the present disclosure contemplate the possibility of a wide range of component value parameters while maintaining the same or nearly the same performance across such variations.

Figure 3A:
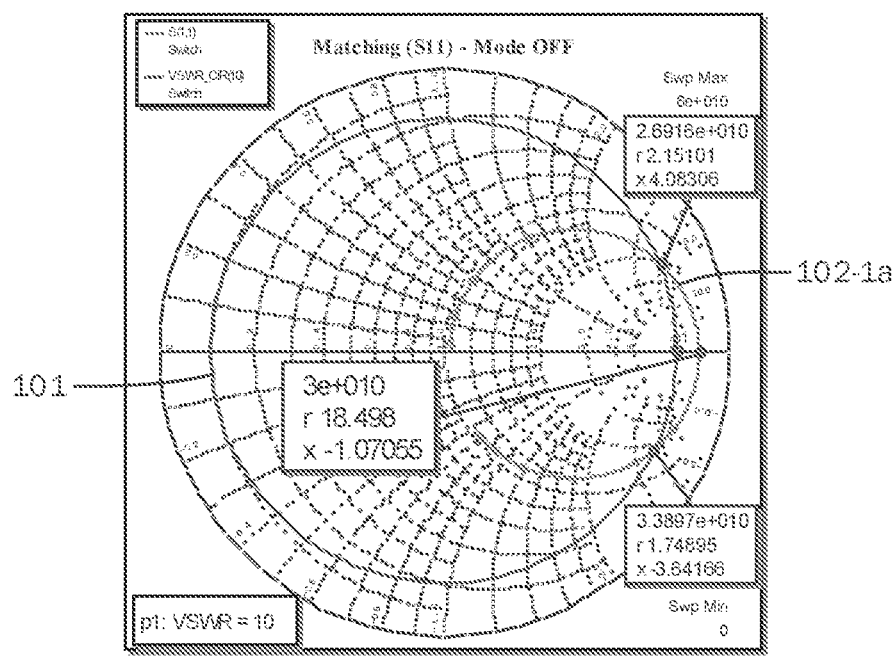
FIG. 3A is a Smith chart plotting the simulated input reflection coefficients (S11) of the first embodiment of the switch with a 2.5 Ohm metallic trace loss associated with each inductor turn and a first set of transistor parameters, when switched off.
Figure 3B:
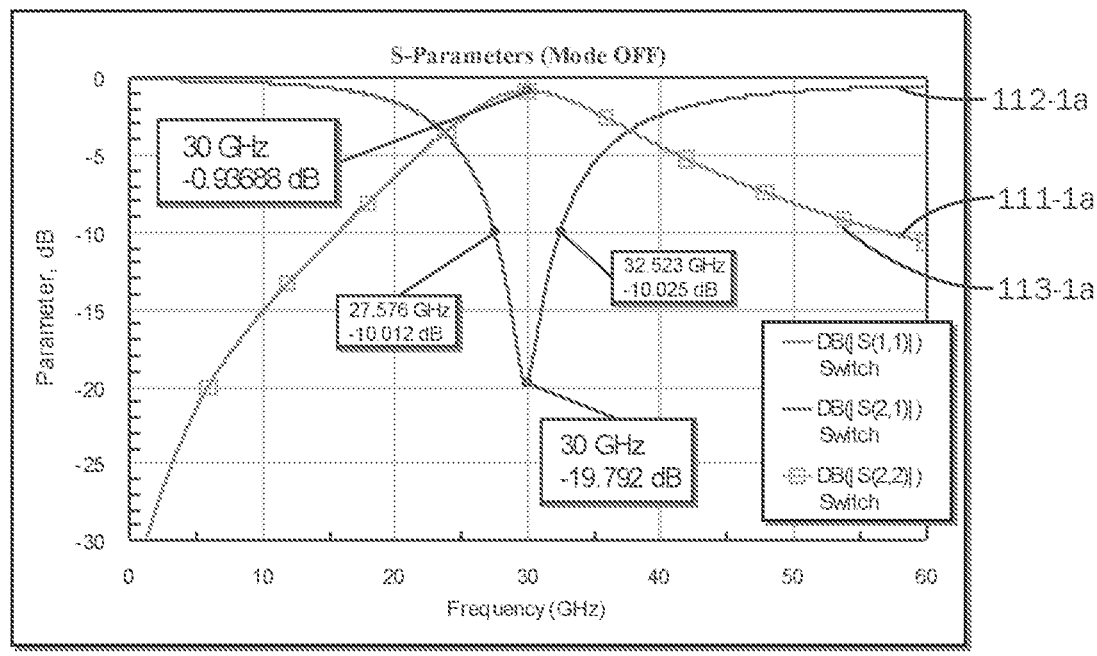
FIG. 3B is a graph plotting a sweep of simulated S-parameters over a frequency range for the first embodiment of the switch with a 2.5 Ohm metallic trace loss associated with each inductor turn and the first set of transistor parameters, when switched off.
Figure 4A:
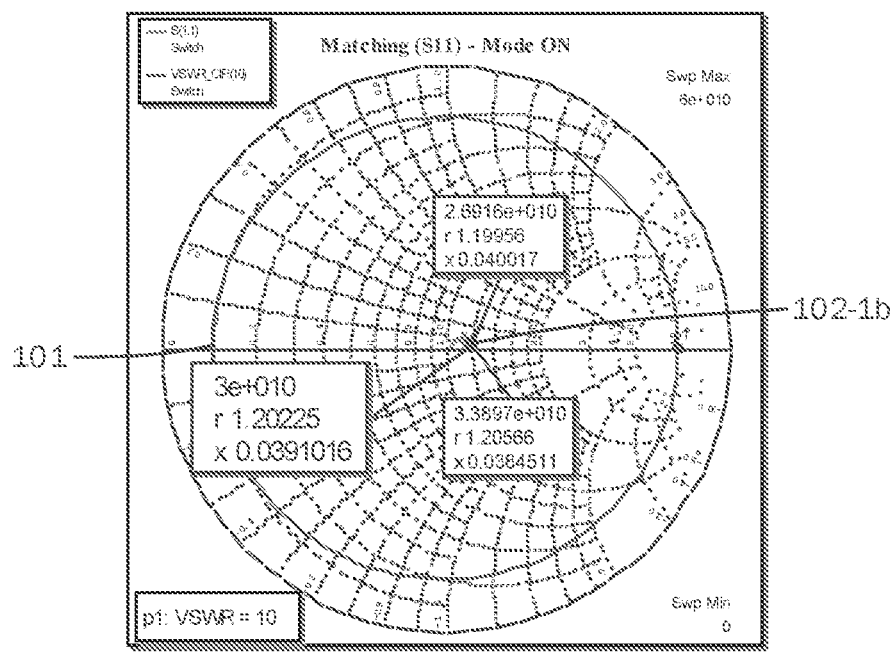
Figure 4B:
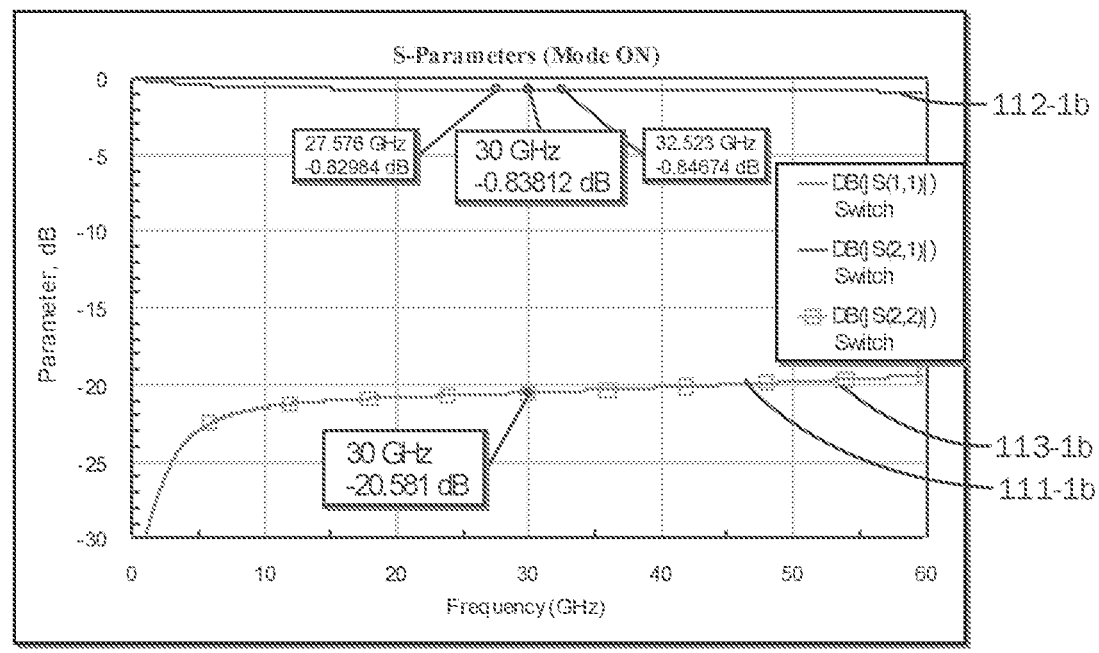

The Smith charts of FIGS. 3A and 4A plot the simulated input reflection coefficients (S11) of the first embodiment of the resonant switch 10a discussed above, in the off/deactivated state and the on/activated state, respectively. In both figures, the first plot 101 represents a reference vertical standing wave ratio (VSWR) of 10:1. In FIG. 3A, the second plot 102-1a is of the input reflection coefficient S11 of the resonant switch 10a in the off/deactivated state. In FIG. 4A, the second plot 102-1b is for the on/activated state. The graphs of FIGS. 3B and 4B plot the simulated scattering parameters (S-parameters) of the first embodiment of the resonant switch 10a in the off/deactivated state and the on/activated state, respectively. Specifically, in FIG. 3B, a first plot 111-1a is of the first port reflection coefficient S11, a second plot 112-1a is of the insertion loss S21, and the third plot 113-1a is of the second port reflection coefficient S22, all of which are for the first embodiment of the resonant switch 10a being in the off/deactivated state. In FIG. 4B, a first plot 111-1b is of the first port reflection coefficient S11, a second plot 112-1b is of the insertion loss S21, and the third plot 113-1b is of the second port reflection coefficient S22, all of which are for the first embodiment of the resonant switch 10a being in the on/activated state.

In this simulation, the center inductor L2, the first peripheral inductor L1, and the second peripheral inductor L2 each have an inductance value of 250 pico Henries (pH), as well as a resistance of 2.5 Ohm per turn. The Q (quality factor) of each of these inductors is 19, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 80 femto Farad(fF) with a resistive component of 0.2 Ohm. The following simulations were performed with various transistor parameters to demonstrate the wide range of possible configuration options. A first set of transistor parameters defines the switching resistance RSW in the on mode to 10 Ohm, and the switching capacitance CSW in the off mode to 20 fF and a resistive component of 20 Ohm.

Figure 5A:
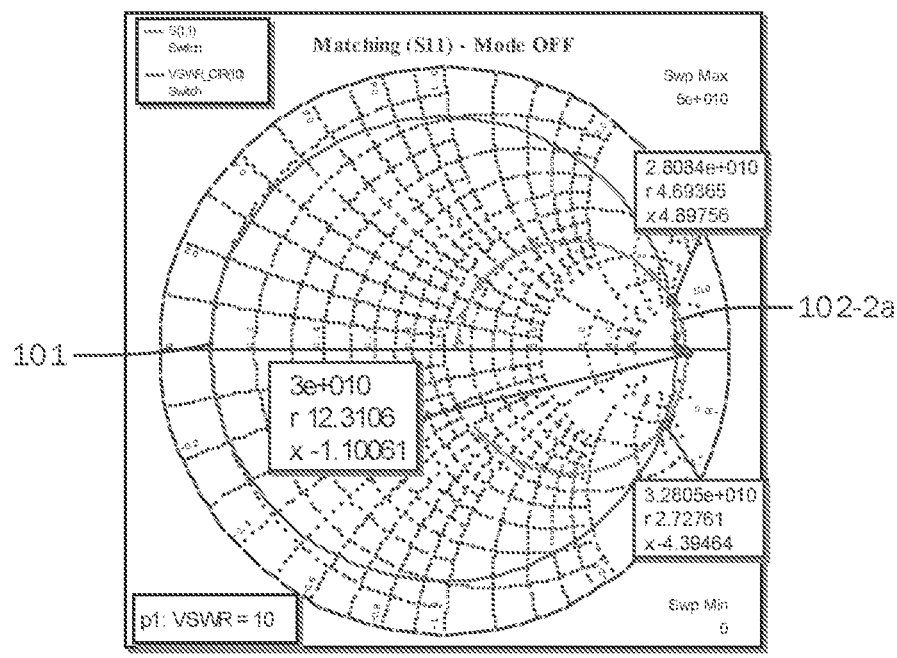
FIG. 5A is a Smith chart plotting the simulated input reflection coefficients (S11) of the first embodiment of the switch with a 5 Ohm metallic trace loss associated with each inductor turn and the first set of transistor parameters, when switched off.
Figure 5B:
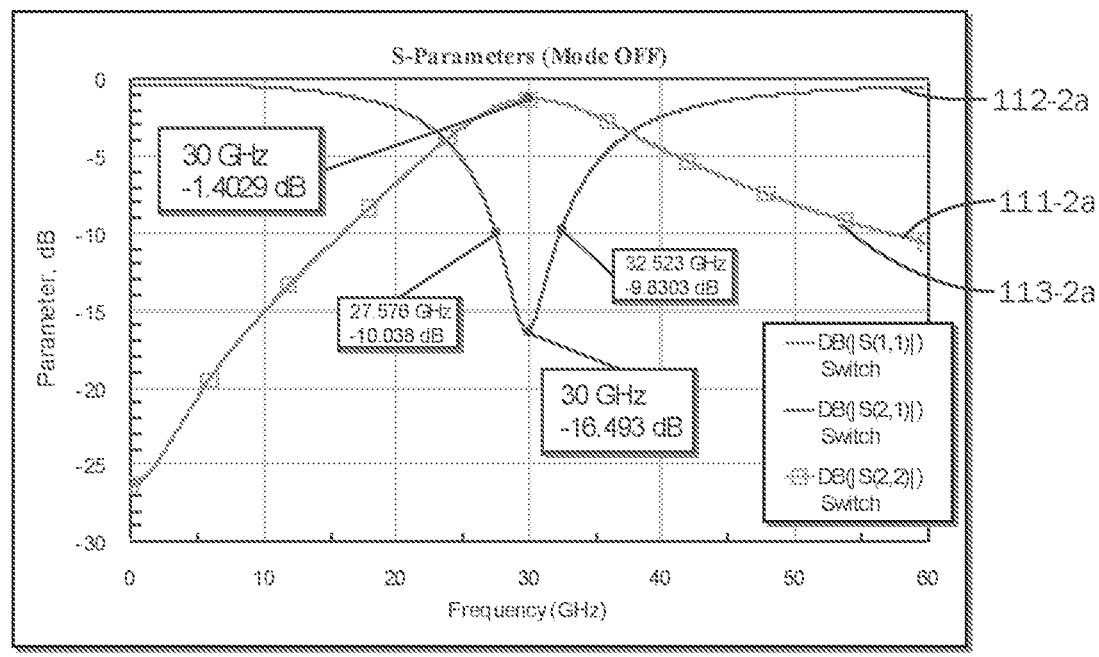
FIG. 5B is a graph plotting a sweep of simulated S-parameters over a frequency range for the first embodiment of the switch with a 5 Ohm metallic trace loss associated with each inductor turn and the first set of transistor parameters, when switched off.
Figure 6A:
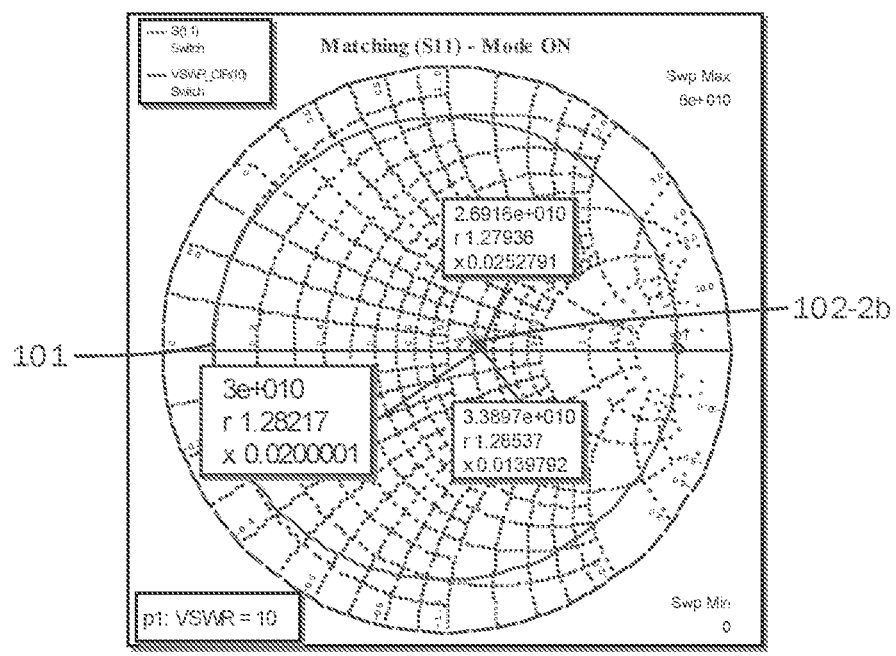
Figure 6B:
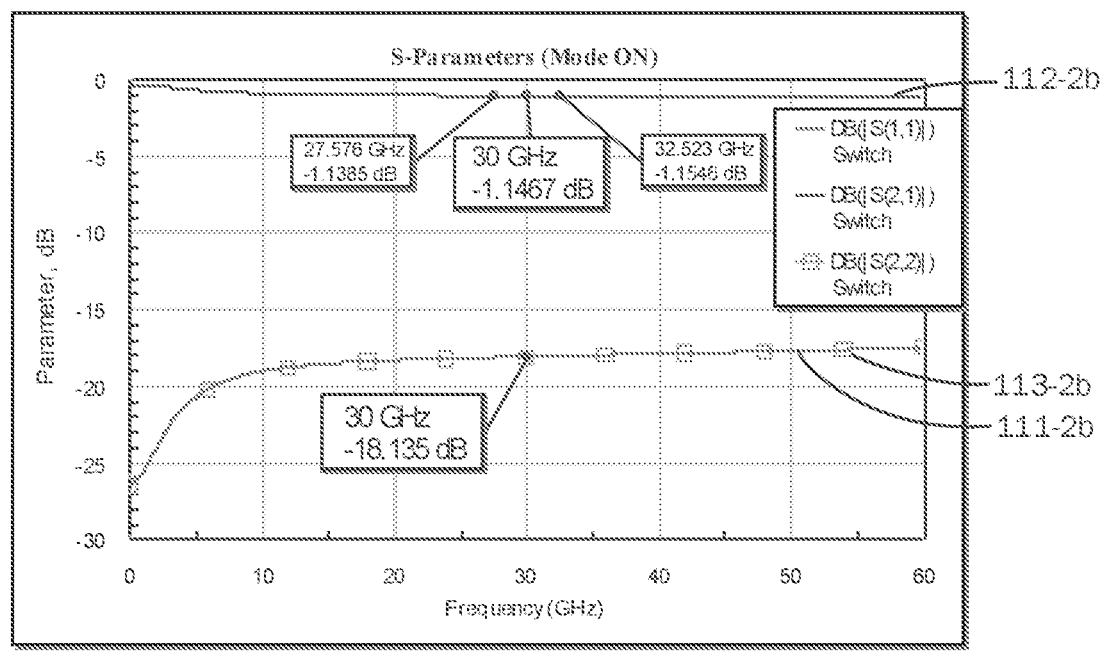

The Smith charts of FIGS. 5A and 6A plot the simulated input reflection coefficients (S11) of the first embodiment of the resonant switch 10a discussed above, in the off/deactivated state and the on/activated state, respectively. The graphs of FIGS. 5B and 6B plot the simulated scattering parameters (S-parameters) of the first embodiment of the resonant switch 10a in the off/deactivated state and the on/activated state, respectively. The metallic trace loss has been doubled in this simulation, which is envisioned to increase the insertion loss by less than 0.3 dB. The overall insertion loss remains below 1.15 dB, which is understood to be suitable for mmWave frequencies. In further detail, the simulation parameters for the center inductor L2, the first peripheral inductor L1, and the second peripheral inductor L2 each have their inductance values set to 250 pH, as well as a resistance of 5 Ohm per turn. The Q of each of these inductors is 9.5, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 80 fF with a resistive component of 0.2 Ohm. The same first set of transistor parameters indicated above were utilized, including the switching resistance RSW in the on mode to 10 Ohm, and the switching capacitance CSW in the off mode to 20 fF and a resistive component of 20 Ohm.

Again, in both FIGS. 5A and 6A, the first plot 101 represents a reference vertical standing wave ratio (VSWR) of 10:1. In FIG. 5A, the second plot 102-2a is of the input reflection coefficient S11 of the resonant switch 10a in the off/deactivated state. In FIG. 6A, the second plot 102-2b is for the on/activated state.

In the graph of FIG. 5B, first plot 111-2a is of the first port reflection coefficient S11, a second plot 112-2a is of the insertion loss S21, and the third plot 113-2a is of the second port reflection coefficient S22, all of which are for the first embodiment of the resonant switch 10a being in the off/deactivated state as simulated with the above-described parameter values. In FIG. 6B, a first plot 111-2b is of the first port reflection coefficient S11, a second plot 112-2b is of the insertion loss S21, and the third plot 113-2b is of the second port reflection coefficient S22, all of which are for the first embodiment of the resonant switch 10a being in the on/activated state as simulated with the above-described parameter values.

Figure 7A:
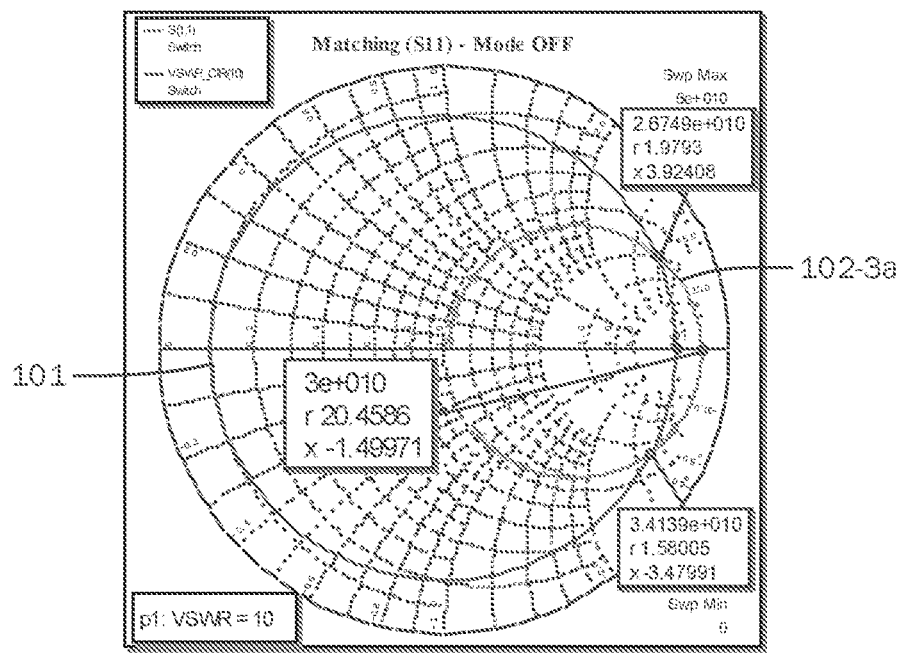
FIG. 7A is a Smith chart plotting the simulated input reflection coefficients (S11) of the first embodiment of the switch with a 2.5 Ohm metallic trace loss associated with each inductor turn and a second set of transistor parameters, when switched off.
Figure 7B:
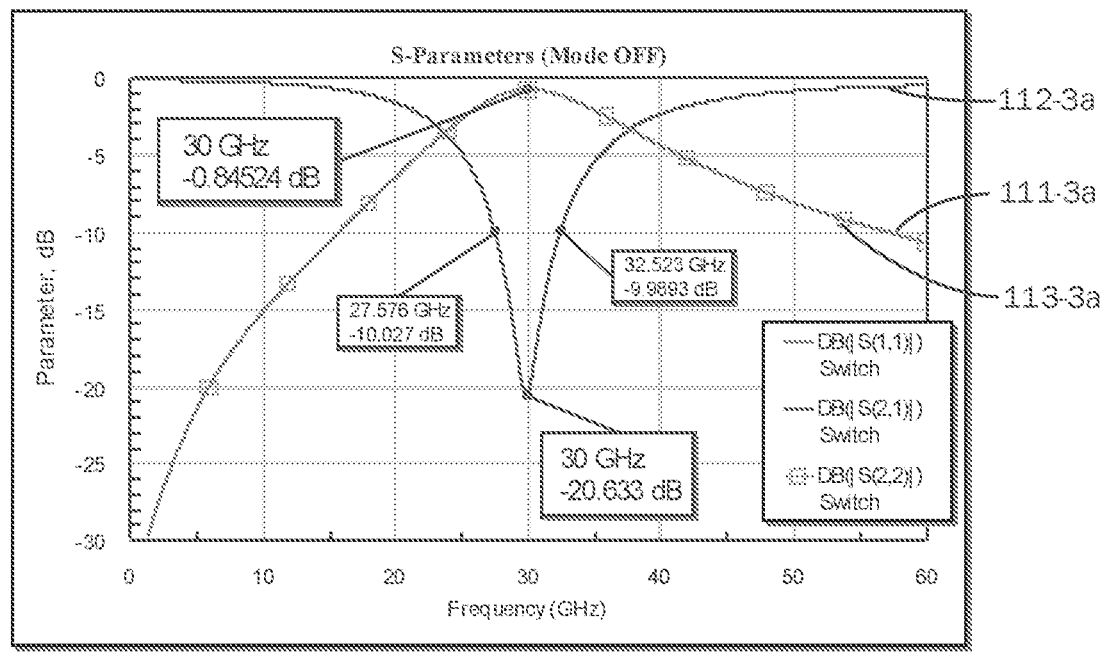
FIG. 7B is a graph plotting a sweep of simulated S-parameters over a frequency range for the first embodiment of the switch with a 2.5 Ohm metallic trace loss associated with each inductor turn and the second set of transistor parameters, when switched off.
Figure 8A:
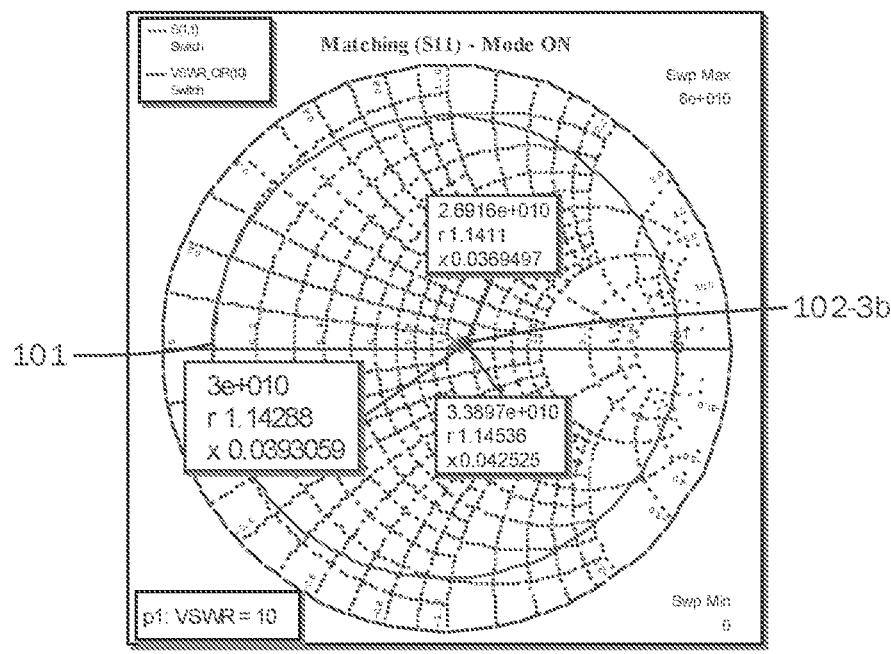
Figure 8B:
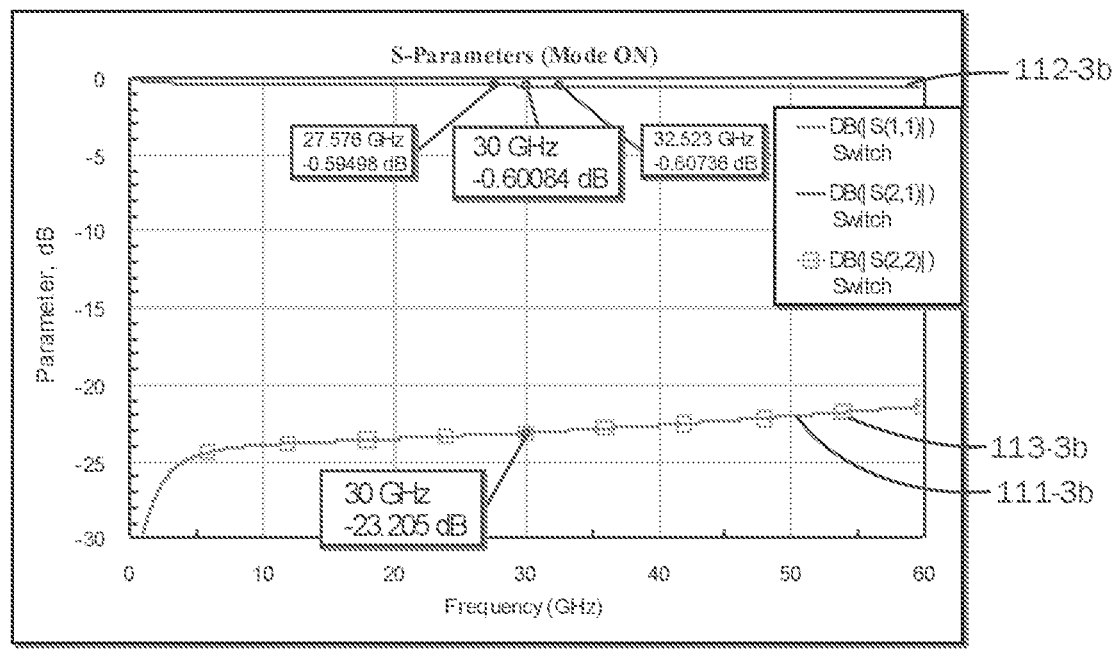

The Smith charts of FIGS. 7A and 8A plot the simulated input reflection coefficients (S11) of the first embodiment of the resonant switch 10a discussed above, in the off/deactivated state and the on/activated state, respectively. The graphs of FIGS. 7B and 8B plot the simulated scattering parameters (S-parameters) of the first embodiment of the resonant switch 10a in the off/deactivated state and the on/activated state, respectively. The transistor size has been doubled for this simulation, which is understood to halve the on-mode resistance RSW to 5 Ohm, as well as reduce the resistance component of the off-mode capacitance CSW to 15 Ohm (while maintaining the capacitive component to 20 fF). This configuration of the transistor may be referred to as a second set of transistor parameters.

The metallic trace loss has been reverted to the first values of 2.5 Ohm per turn. Again, the center inductor L2, the first peripheral inductor L1, and the second peripheral inductor L2 each have their inductance values set to 250 pH. The Q of each of these inductors is 19, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 80 fF with a resistive component of 0.2 Ohm.

In both FIGS. 7A and 8A, the first plot 101 represents a reference vertical standing wave ratio (VSWR) of 10:1. In FIG. 7A, the second plot 102-3a is of the input reflection coefficient S11 of the resonant switch 10a in the off/deactivated state. In FIG. 8A, the second plot 102-3b is for the on/activated state.

In the graph of FIG. 7B, first plot 111-3a is of the first port reflection coefficient S11, a second plot 112-3a is of the insertion loss S21, and the third plot 113-3a is of the second port reflection coefficient S22, all of which are for the first embodiment of the resonant switch 10a being in the off/deactivated state as simulated with the above-described parameter values. In FIG. 8B, a first plot 111-3b is of the first port reflection coefficient S11, a second plot 112-3b is of the insertion loss S21, and the third plot 113-3b is of the second port reflection coefficient S22, all of which are for the first embodiment of the resonant switch 10a being in the on/activated state as simulated with the above-described parameter values.

This simulation demonstrates that an increase in the transistor size only reduces the insertion loss by approximately 0.25 dB, while the overall loss remains around 0.6 dB. Again, at mmWave frequencies, this extent of loss is understood to achieve performance objectives of the resonant switch 10 of the present disclosure.

Figure 9A:
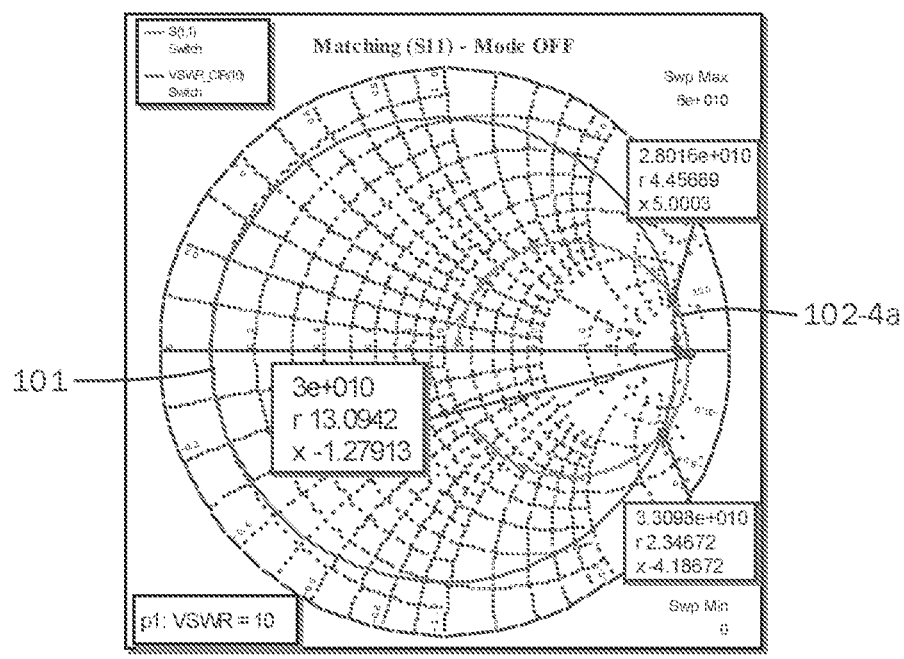
FIG. 9A is a Smith chart plotting the simulated input reflection coefficients (S11) of the first embodiment of the switch with a 5 Ohm metallic trace loss associated with each inductor turn and the second set of transistor parameters, when switched off.
Figure 9B:
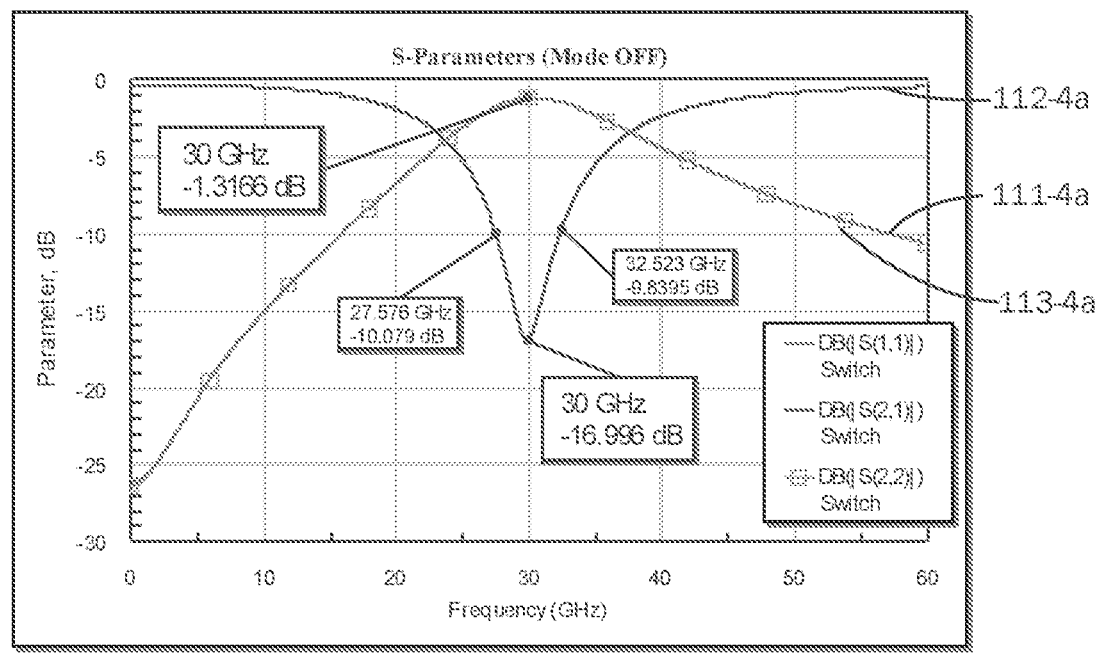
FIG. 9B is a graph plotting a sweep of simulated S-parameters over a frequency range for the first embodiment of the switch with a 5 Ohm metallic trace loss associated with each inductor turn and the second set of transistor parameters, when switched off.
Figure 10A:
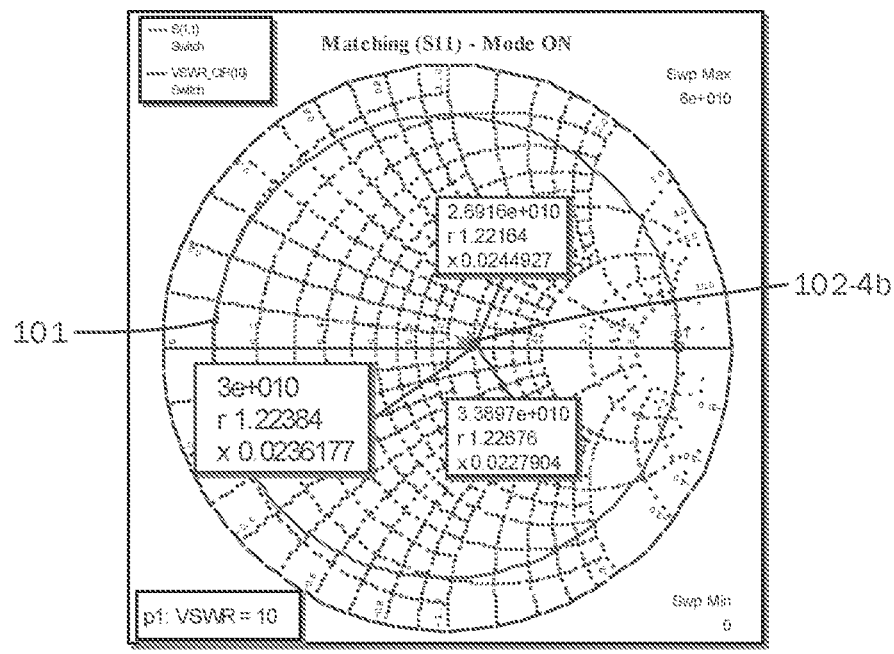
Figure 10B:
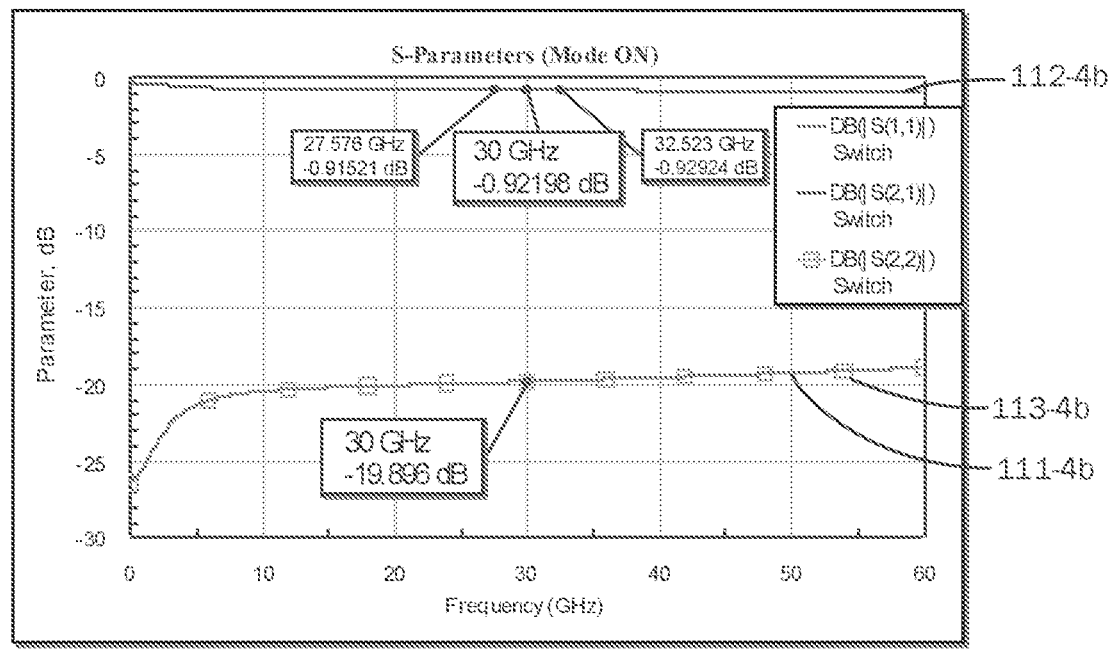

The Smith charts of FIGS. 9A and 10A plot the simulated input reflection coefficients (S11) of the first embodiment of the resonant switch 10a discussed above, in the off/deactivated state and the on/activated state, respectively. The graphs of FIGS. 9B and 10B plot the simulated scattering parameters (S-parameters) of the first embodiment of the resonant switch 10a in the off/deactivated state and the on/activated state, respectively. In this simulation, the metallic trace loss has been doubled as has the transistor size. Accordingly, the metallic trace loss is set to 5 Ohm per turn, and the on-mode resistance RSW is reduced to 5 Ohm, while the resistance component of the off-mode capacitance CSW is reduced to 15 Ohm (while maintaining the capacitive component to 20 fF). As indicated above, this configuration of the transistor may be referred to as the second set of transistor parameters.

The center inductor L2, the first peripheral inductor L1, and the second peripheral inductor L2 each have their inductance values set to 250 pH. The Q of each of these inductors is 19, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 80 fF with a resistive component of 0.2 Ohm.

In both FIGS. 9A and 10A, the first plot 101 represents a reference vertical standing wave ratio (VSWR) of 10:1. In FIG. 9A, the second plot 102-4a is of the input reflection coefficient S11 of the resonant switch 10a in the off/deactivated state. In FIG. 10A, the second plot 102-4b is for the on/activated state.

In the graph of FIG. 9B, first plot 111-4a is of the first port reflection coefficient S11, a second plot 112-4a is of the insertion loss S21, and the third plot 113-4a is of the second port reflection coefficient S22, all of which are for the first embodiment of the resonant switch 10a being in the off/deactivated state as simulated with the above-described parameter values. In FIG. 9B, a first plot 111-4b is of the first port reflection coefficient S11, a second plot 112-4b is of the insertion loss S21, and the third plot 113-4b is of the second port reflection coefficient S22, all of which are for the first embodiment of the resonant switch 10a being in the on/activated state as simulated with the above-described parameter values.

This simulation demonstrates that an increase in the transistor size and the metallic trace loss reduces the insertion loss by less than 0.1 dB, while the overall loss remains around 0.9 dB. These performance metrics likewise satisfy the objectives of the resonant switch 10 at mmWave frequencies.

The schematic diagram of FIG. 11 depicts a second embodiment of a resonant switch 10b, which likewise includes the first port 12a and the second port 12b to which various other circuit components may be connected. Generally, the second embodiment 10b incorporates the same triple inductor network 14 comprised of the center inductor L2, the first peripheral inductor L1, and the second peripheral inductor L3. As will be described in further detail below, only a single transistor switch is utilized, and so the interconnections of the inductors slightly vary.

Again, the center inductor L2 is defined by the first terminal 16a-2 that is electrically connected to the first port 12a, and a second terminal 16b-2 that is electrically connected to the second port 12b. The first peripheral inductor L1 likewise has a first terminal 16a-1 and a second terminal 16b-1, while the second peripheral inductor L2 has a first terminal 16a-3 and a second terminal 16b-3. In one embodiment, the inductors L1, L2, and L3 may be implemented as a series of metallic traces on the semiconductor die and routed to define one or more turns that are spaced apart from each other and electromagnetically coupled.

The peripheral inductors L1, L3 are a part of the one transistor switch 18 that is a constituent element of the resonant switch 10. In the illustrated embodiment, the transistor switch 18 has a single transistor 20. In the illustrated second embodiment of the resonant switch 10b, the transistor 20 is contemplated to be a field effect transistor that has a gate terminal, a drain terminal, and a source terminal. More specifically, such a field effect transistor is understood to be a MOSFET transistor. In the illustrated example, the transistor 20 is of the N-type, that is, having an n-type drain and source, and a p-type substrate. This is by way of example only and not of limitation, and P-type transistors may be substituted if desired. Moreover, the specific fabrication technology need not be limited to metal oxide semiconductor, and any other suitable transistor type may be substituted in the transistor switch 18.

In the transistor switch 18, the drain terminal of the transistor 20 is connected to the first terminal 16a-1 of the first peripheral inductor L1, while the source terminal is connected to the second terminal 16b-3 of the second peripheral inductor L3. The first terminal 16a-3 of the second peripheral inductor L3 is connected to the second terminal 16b-1 of the first peripheral inductor L1. The gate terminals of the transistor 20 may be connected to a control signal source that can either drive the gate high or low (on or off).

The second embodiment of the resonant switch 10b likewise includes the capacitor 22 that is connected in parallel to the triple inductor network 14. The capacitor 22 includes the first terminal 24a that is connected to the first port 12a, along with a second terminal 24b that is connected to the second port 12b. The capacitor 22 and the connection to the other segments of the resonant switch 10b may also have an associated parasitic resistance R that is shown in series with the capacitor 22.

The capacitor 22 and the center inductor L3 are understood to define a parallel resonance at a predefined operating frequency range when the resonant switch 10a is in the off or deactivated mode. Such off/deactivated mode is set when the transistor switch 18, and specifically the transistor 20 thereof, is deactivated or turned off. The transistor 20 is so deactivated/turned off when the gate voltage is set low.

The schematic diagram of FIG. 12A depicts an equivalent circuit of the resonant switch 10b in this state. With the transistor 20 turned off, the nodes of the circuit corresponding to the source and the drain have a high impedance. There is a slight parasitic capacitance C', along with a parasitic resistance R' associated with the transistor 20 that is in the off or deactivated state. With the capacitor 22 being tuned to define a parallel resonance with the center inductor L2, a high degree of isolation across the first port 12a and the second port 12b may be achieved. In order to achieve such isolation at the same resonant frequency, the value of the capacitor 22 may be reduced in the second embodiment of the resonant switch 10b relative to the first embodiment 10a.

When the resonant switch 10b is in the on or activated mode, the transistor switch 18, that is, the transistor 20 is likewise activated or turned on. The transistor 20 is so activated/turned on when the gate voltage is set high. In this state, the transistors 20 define a low series resistance.

The schematic diagram of FIG. 12B depicts an equivalent circuit of the resonant switch 10b in this state. As shown, there is a resistance R' associated with the transistor 20 of the transistor switch 18. The magnetic flux in the center inductor L2 is understood to be cancelled by the magnetic flux in the opposite direction from the first peripheral inductor L1 and the second peripheral inductor L3, both of which are electromagnetically or inductively coupled to the center inductor L2. Such counteracting magnetic flux is generated as a consequence of the transistors 20 being activated/turned on. Thus, the insertion loss associated with the center inductor L2 may be substantially minimized. It is expressly contemplated that the primary or significant contribution to the overall return loss of the resonant switch 10b from the first port 12a to the second port 12b may be limited to that which is associated with the resistive losses from the metallic traces of the center inductor L2. The overall insertion loss may be further reduced in this second embodiment of the resonant switch 10a relative to the first embodiment 10b.

Figure 13A:
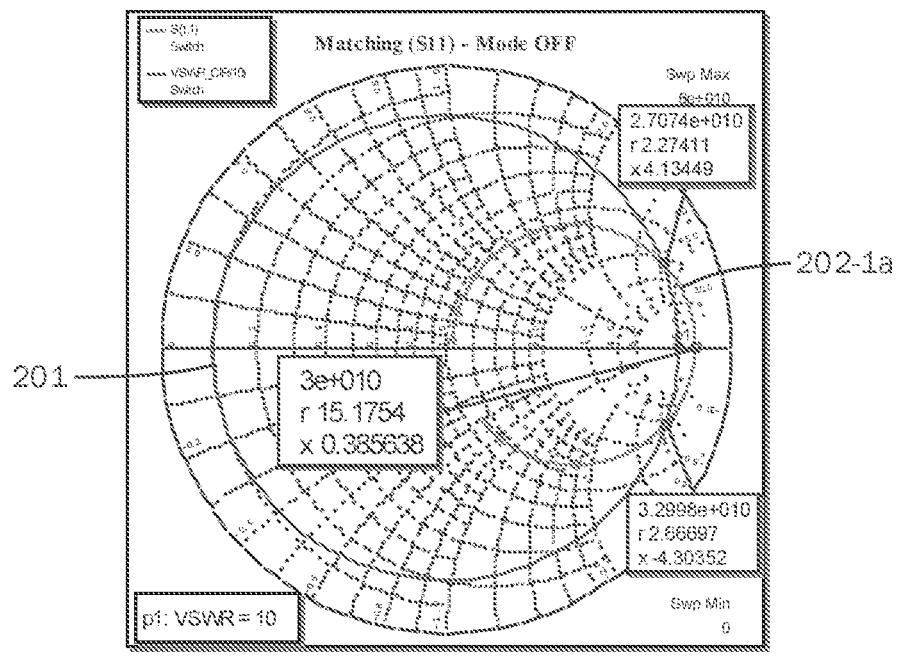
FIG. 13A is a Smith chart plotting the simulated input reflection coefficients (S11) of the second embodiment of the switch with a 2.5 Ohm metallic trace loss associated with each inductor turn and the first set of transistor parameters, when switched off.
Figure 13B:
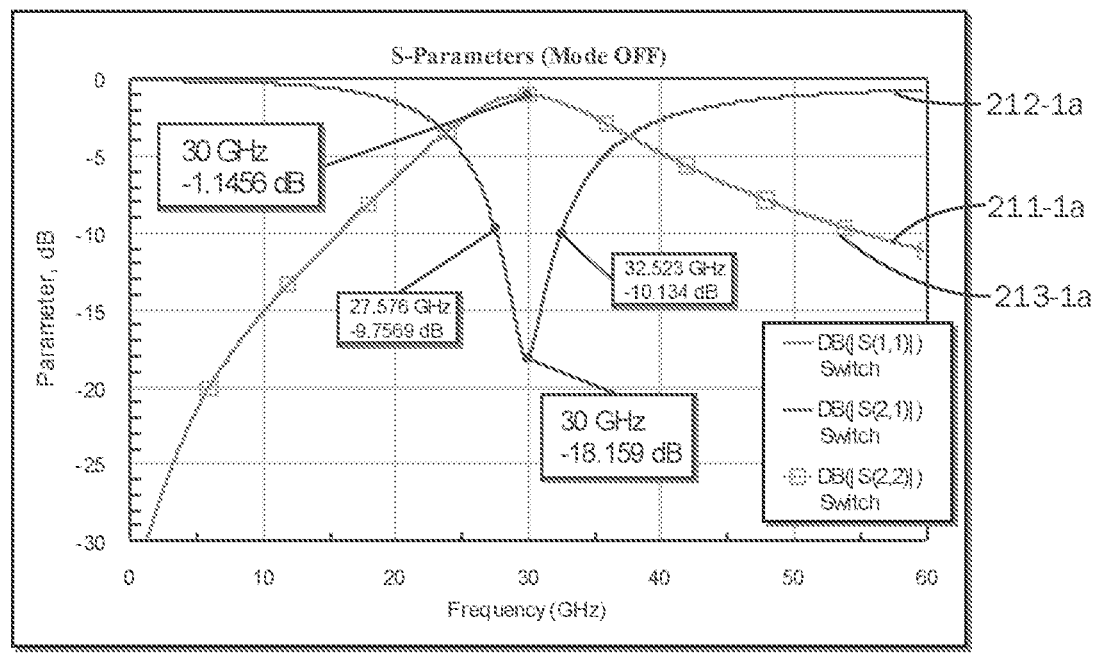
FIG. 13B is a graph plotting a sweep of simulated S-parameters over a frequency range for the second embodiment of the switch with a 2.5 Ohm metallic trace loss associated with each inductor turn and the first set of transistor parameters, when switched off.
Figure 14A:
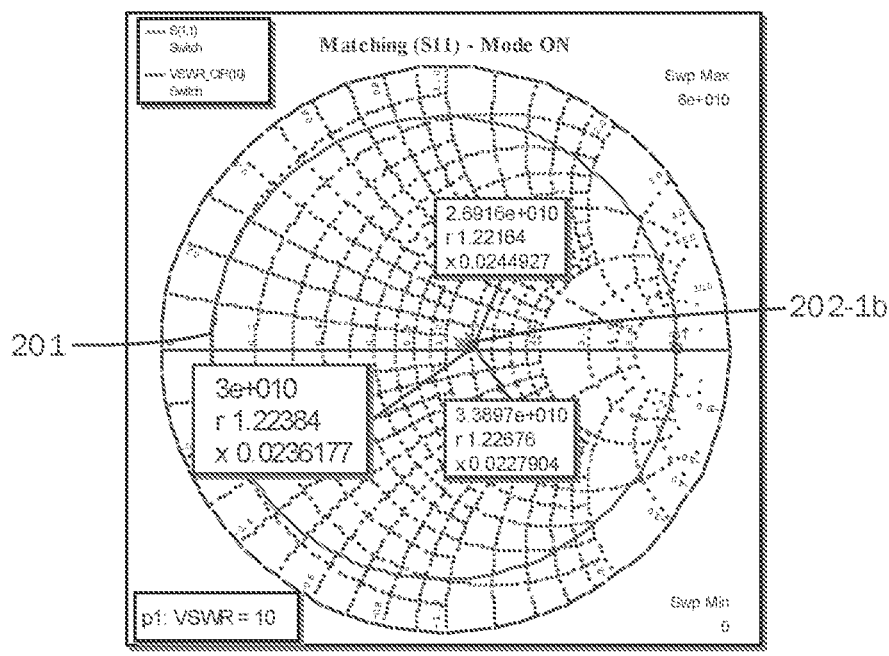
Figure 14B:
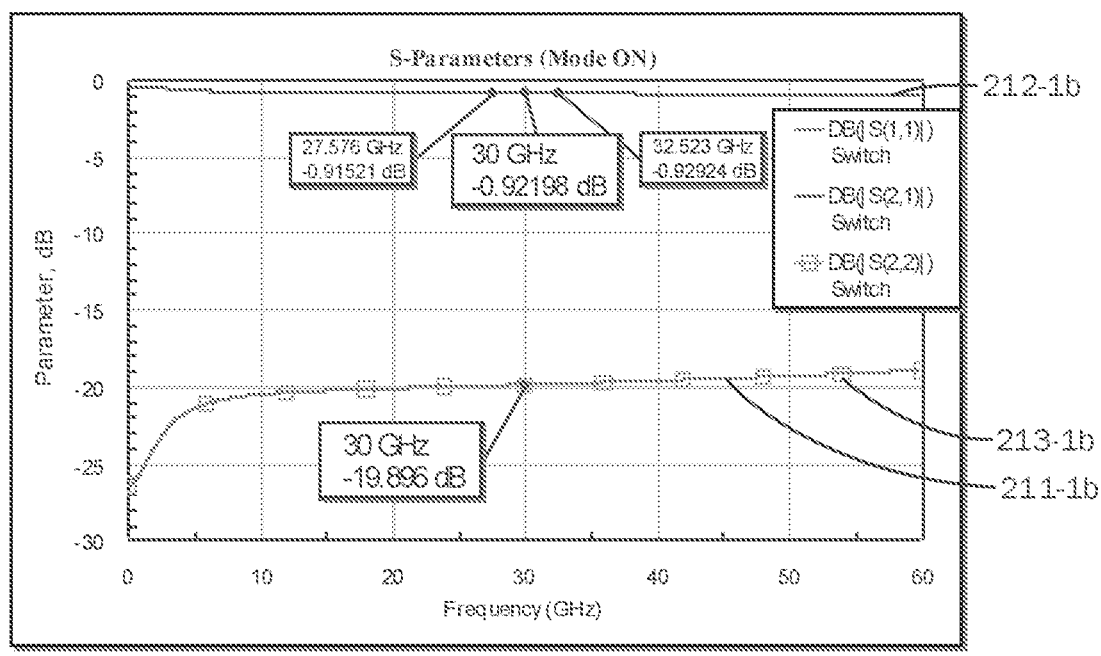

As will be demonstrated in the simulated performance results of the second embodiment of the resonant switch 10b, a wide range of component value parameters are possible while maintaining the same or nearly the same performance across such variations. The Smith charts of FIGS. 13A and 14A plot the simulated input reflection coefficients (S11) of the second embodiment of the resonant switch 10b discussed above, in the off/deactivated state and the on/activated state, respectively. In both figures, the first plot 201 represents a reference vertical standing wave ratio (VSWR) of 10:1. In FIG. 13A, the second plot 202-1a is of the input reflection coefficient S11 of the resonant switch 10b in the off/deactivated state. In FIG. 14A, the second plot 202-1b is for the on/activated state. The graphs of FIGS. 13B and 14B plot the simulated scattering parameters (S-parameters) of the second embodiment of the resonant switch 10b in the off/deactivated state and the on/activated state, respectively. Specifically, in FIG. 13B, a first plot 211-1a is of the first port reflection coefficient S11, a second plot 212-1a is of the insertion loss S21, and the third plot 213-1a is of the second port reflection coefficient S22, all of which are for the second embodiment of the resonant switch 10b being in the off/deactivated state. In FIG. 14B, a first plot 211-1b is of the first port reflection coefficient S11, a second plot 212-1b is of the insertion loss S21, and the third plot 213-1b is of the second port reflection coefficient S22, all of which are for the second embodiment of the resonant switch 10b being in the on/activated state.

In this simulation, the center inductor L2, the first peripheral inductor L1, and the second peripheral inductor L2 each have an inductance value of 250 pH, as well as a resistance of 2.5 Ohm per turn. The Q of each of these inductors is 19, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 46 fF with a resistive component of 0.2 Ohm. The aforementioned first set of transistor parameters, defined by the switching resistance RSW in the on mode as 10 Ohm, and the switching capacitance CSW in the off mode as 20 fF with a resistive component of 20 Ohm, was utilized for this simulation. This simulation yielded an insertion loss of approximately 0.58 dB, which is a reduction when compared to the approximately 0.84 dB loss for the simulation of the first embodiment of the resonant switch 10a that utilizes two transistor switches 18 discussed above.

Figure 15A:
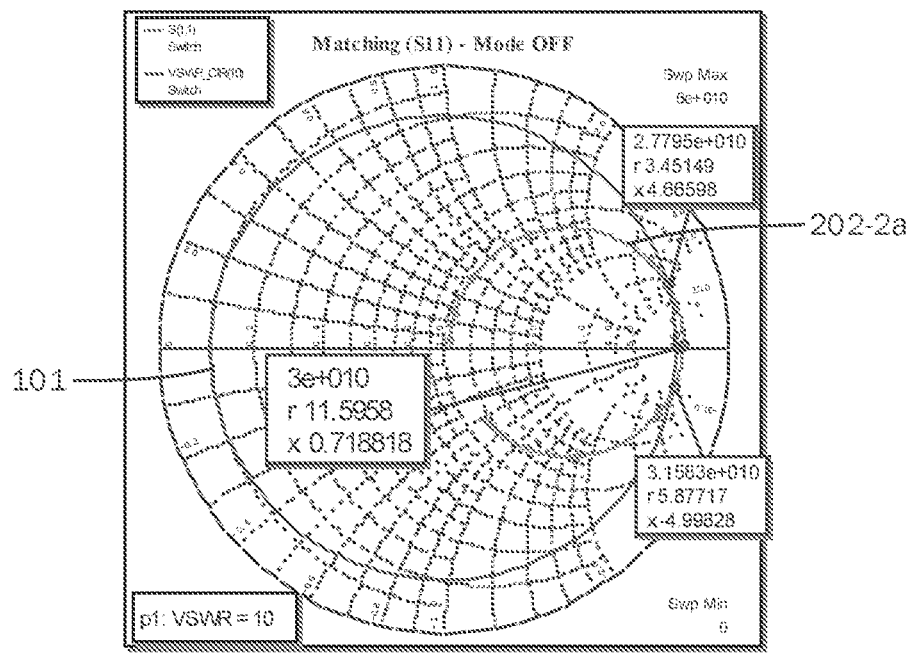
FIG. 15A is a Smith chart plotting the simulated input reflection coefficients (S11) of the second embodiment of the switch with a 2.5 Ohm metallic trace loss associated with each inductor turn and a third set of transistor parameters, when switched off.
Figure 15B:
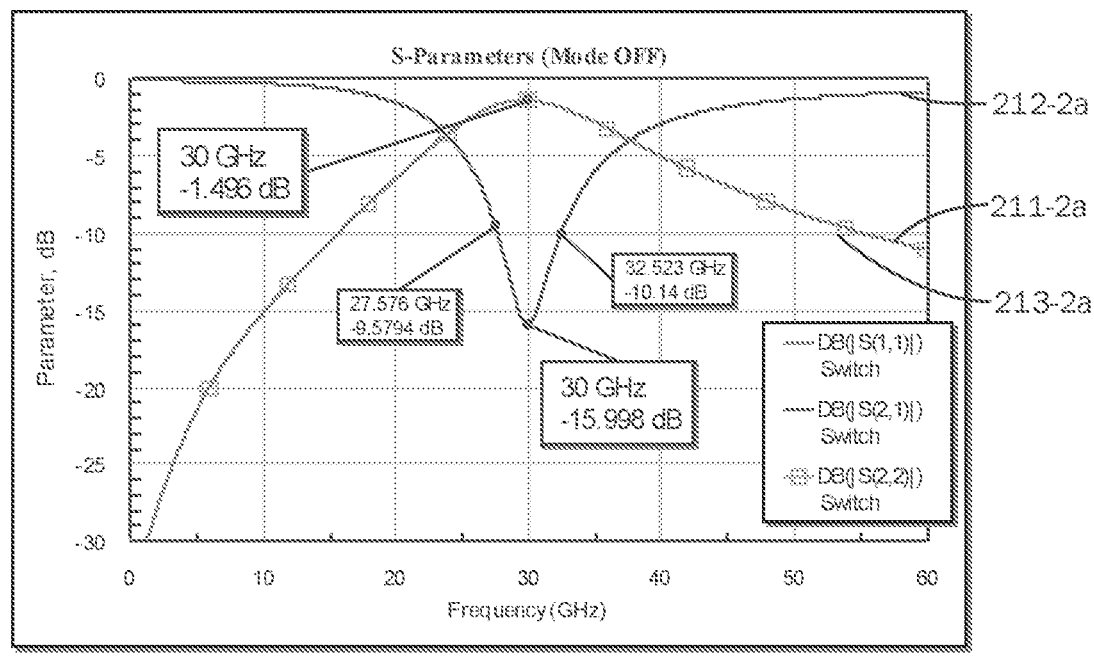
FIG. 15B is a graph plotting a sweep of simulated S-parameters over a frequency range for the second embodiment of the switch with a 2.5 Ohm metallic trace loss associated with each inductor turn and the third set of transistor parameters, when switched off.
Figure 16A:
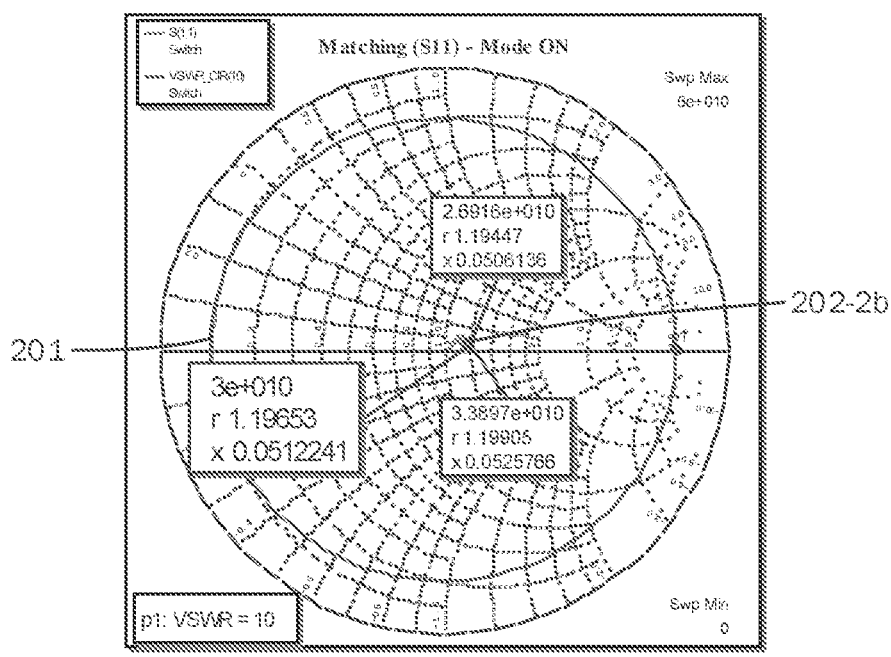
Figure 16B:
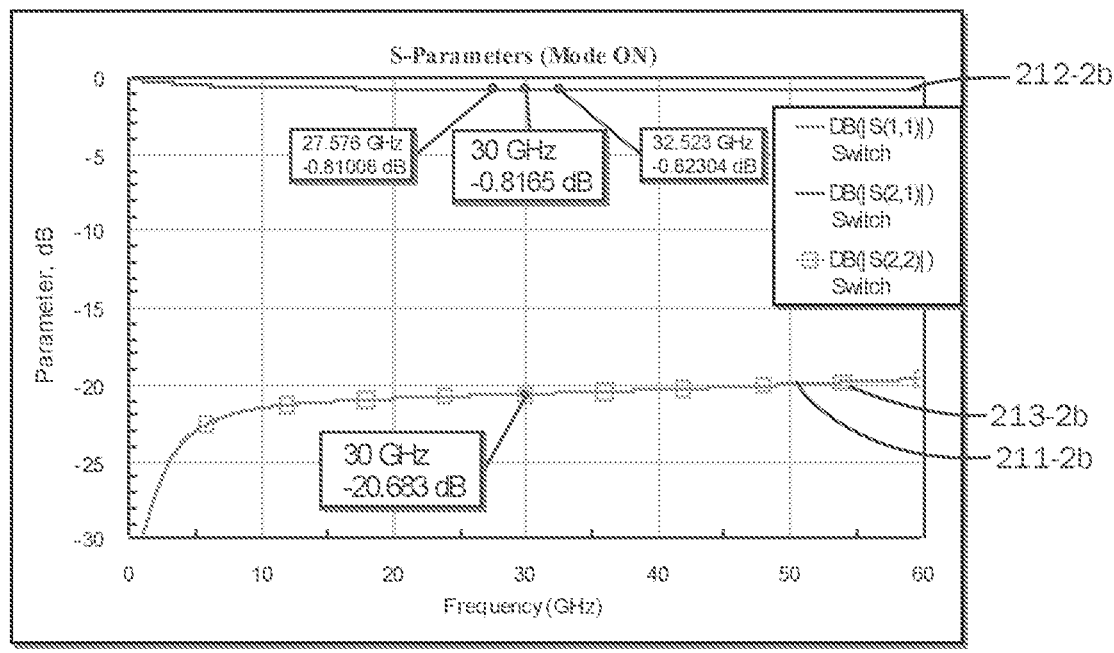

The Smith charts of FIGS. 15A and 16A plot the simulated input reflection coefficients (S11) of the second embodiment of the resonant switch 10b discussed above, in the off/deactivated state and the on/activated state, respectively. The graphs of FIGS. 15B and 16B plot the simulated scattering parameters (S-parameters) of the second embodiment of the resonant switch 10b in the off/deactivated state and the on/activated state, respectively. A third set of transistor values defined by the on-mode resistance RSW of 20 Ohm, and the off-mode capacitance CSW of 20 fF with a resistive component of 30 Ohm, is used for this simulation.

Additional simulation parameters include values for the center inductor L2, the first peripheral inductor L1, and the second peripheral inductor L2, which are set to 250 pH with a resistance of 2.5 Ohm per turn. The Q of each of these inductors is 19, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 46 fF with a resistive component of 0.2 Ohm. The same first set of transistor parameters indicated above were utilized, including the switching resistance RSW in the on mode to 10 Ohm, and the switching capacitance CSW in the off mode to 20 fF and a resistive component of 20 Ohm.

In both FIGS. 15A and 16A, the first plot 201 represents a reference vertical standing wave ratio (VSWR) of 10:1. In FIG. 15A, the second plot 202-2a is of the input reflection coefficient S11 of the resonant switch 10a in the off/deactivated state. In FIG. 16A, the second plot 202-2b is for the on/activated state.

In the graph of FIG. 15B, first plot 211-2a is of the first port reflection coefficient S11, a second plot 212-2a is of the insertion loss S21, and the third plot 213-2a is of the second port reflection coefficient S22, all of which are for the second embodiment of the resonant switch 10b being in the off/deactivated state as simulated with the above-described parameter values. In FIG. 16B, a first plot 211-2b is of the first port reflection coefficient S11, a second plot 212-2b is of the insertion loss S21, and the third plot 213-2b is of the second port reflection coefficient S22, all of which are for the second embodiment of the resonant switch 10b being in the on/activated state as simulated with the above-described parameter values.

Figure 17A:
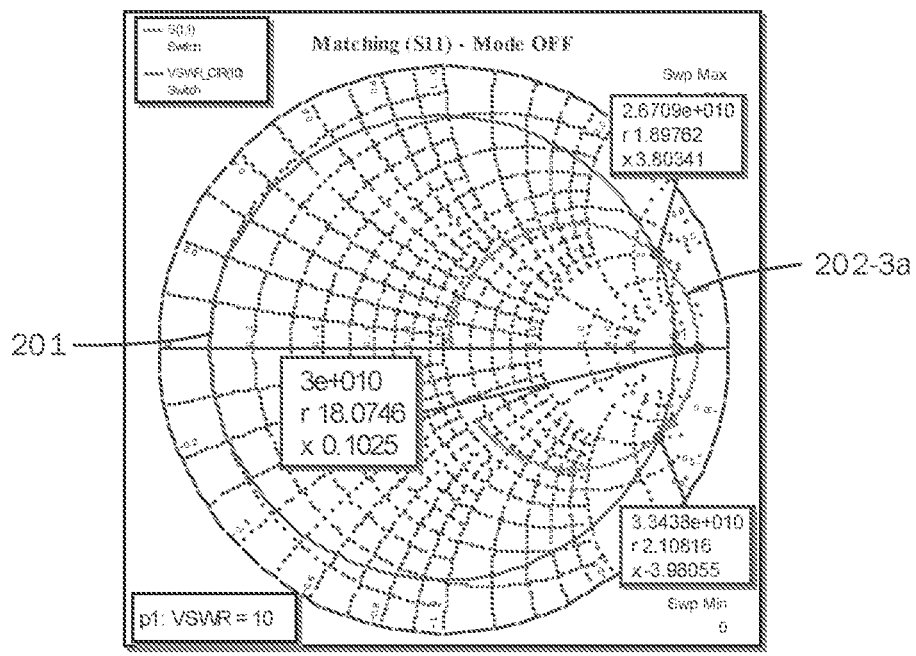
FIG. 17A is a Smith chart plotting the simulated input reflection coefficients (S11) of the second embodiment of the switch with a 2.5 Ohm metallic trace loss associated with each inductor turn and the second set of transistor parameters, when switched off.
Figure 17B:
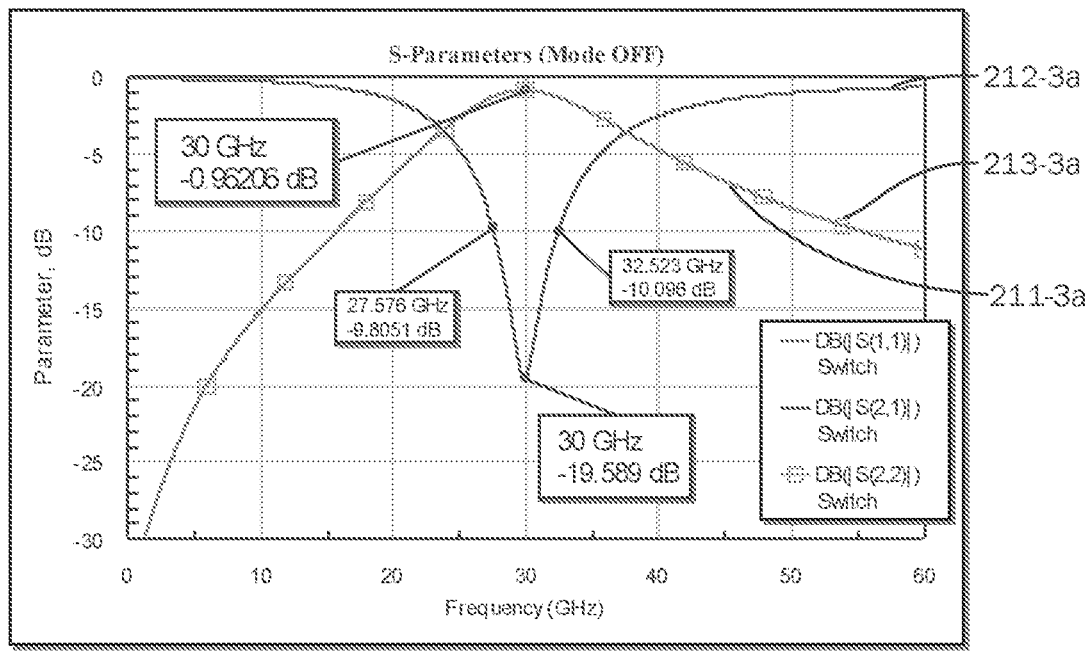
FIG. 17B is a graph plotting a sweep of simulated S-parameters over a frequency range for the second embodiment of the switch with a 2.5 Ohm metallic trace loss associated with each inductor turn and the second set of transistor parameters, when switched off.
Figure 18A:
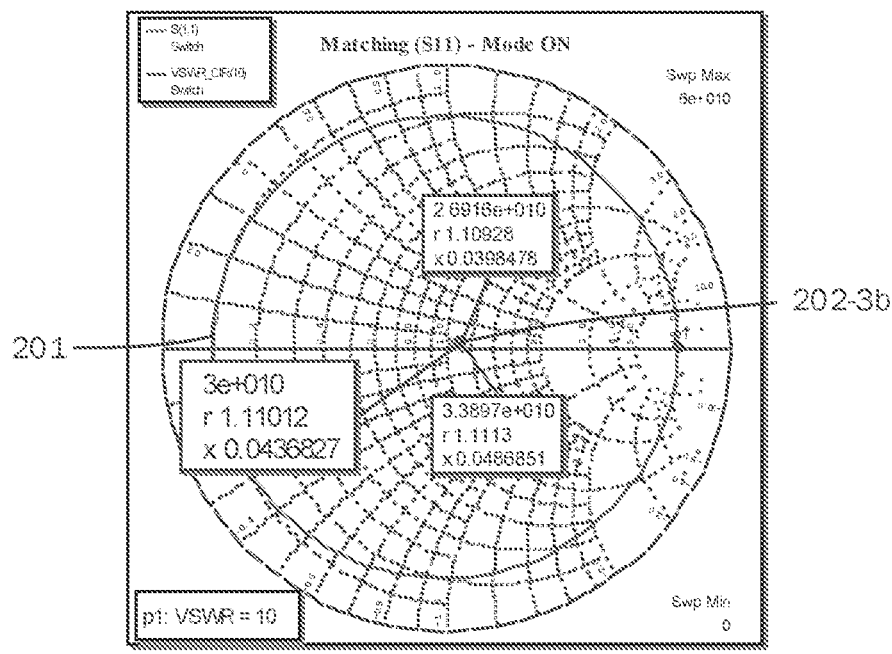
Figure 18B:
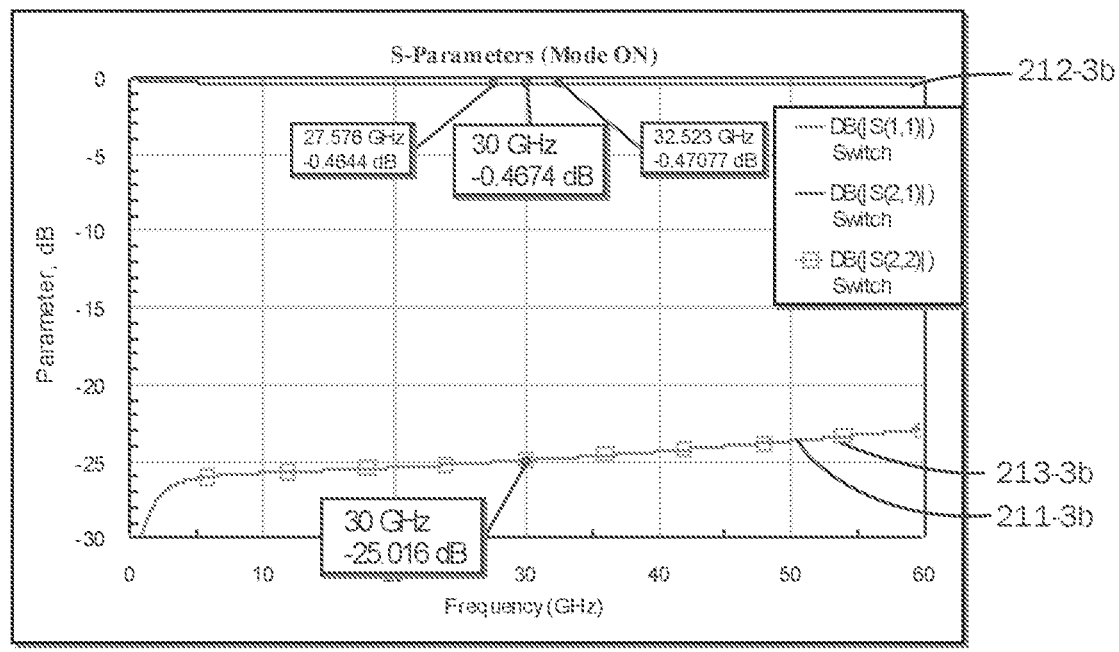

The Smith charts of FIGS. 17A and 18A plot the simulated input reflection coefficients (S11) of the second embodiment of the resonant switch 10b discussed above, in the off/deactivated state and the on/activated state, respectively. The graphs of FIGS. 17B and 18B plot the simulated scattering parameters (S-parameters) of the second embodiment of the resonant switch 10b in the off/deactivated state and the on/activated state, respectively. This simulation likewise uses the second set of transistor parameters, which is the on-mode resistance value RSW of 5 Ohm, an off-mode capacitance value CSW value of 20 fF with a resistive component of 15 Ohm.

The center inductor L2, the first peripheral inductor L1, and the second peripheral inductor L2 each have their inductance values set to 250 pH, and the metallic trace loss is set to 2.5 Ohm per turn. The Q of each of these inductors is 19, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 80 fF with a resistive component of 0.2 Ohm.

In both FIGS. 17A and 18A, the first plot 201 represents a reference vertical standing wave ratio (VSWR) of 10:1. In FIG. 17A, the second plot 202-3a is of the input reflection coefficient S11 of the resonant switch 10b in the off/deactivated state. In FIG. 18A, the second plot 202-3b is for the on/activated state.

In the graph of FIG. 17B, first plot 211-3a is of the first port reflection coefficient S11, a second plot 212-3a is of the insertion loss S21, and the third plot 213-3a is of the second port reflection coefficient S22, all of which are for the first embodiment of the resonant switch 10a being in the off/deactivated state as simulated with the above-described parameter values. In FIG. 18B, a first plot 211-3b is of the first port reflection coefficient S11, a second plot 212-3b is of the insertion loss S21, and the third plot 213-3b is of the second port reflection coefficient S22, all of which are for the second embodiment of the resonant switch 10b being in the on/activated state as simulated with the above-described parameter values.

Figure 19A:
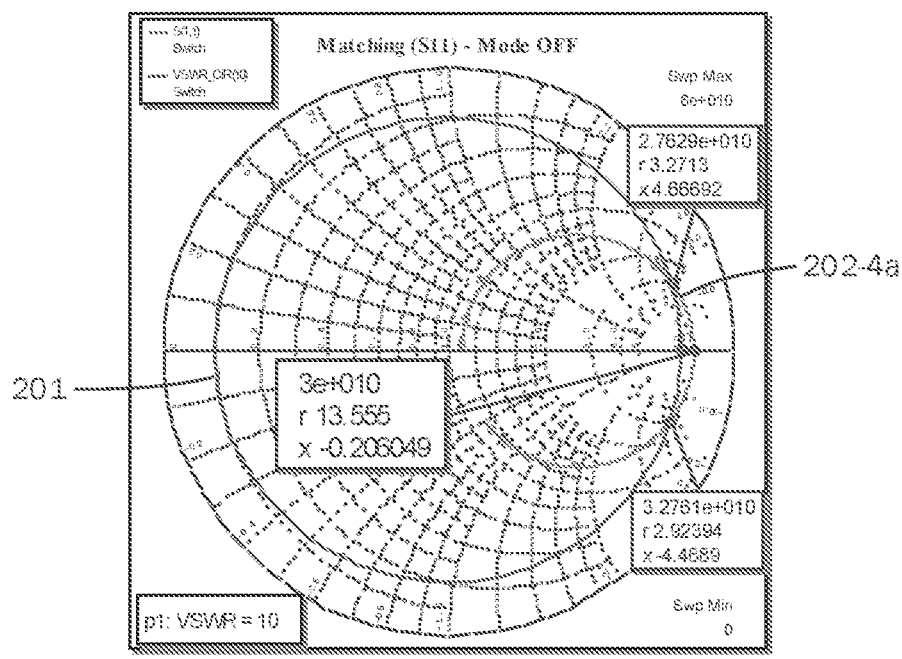
FIG. 19A is a Smith chart plotting the simulated input reflection coefficients (S11) of the second embodiment of the switch with a 5 Ohm metallic trace loss associated with each inductor turn and the second set of transistor parameters, when switched off.
Figure 19B:
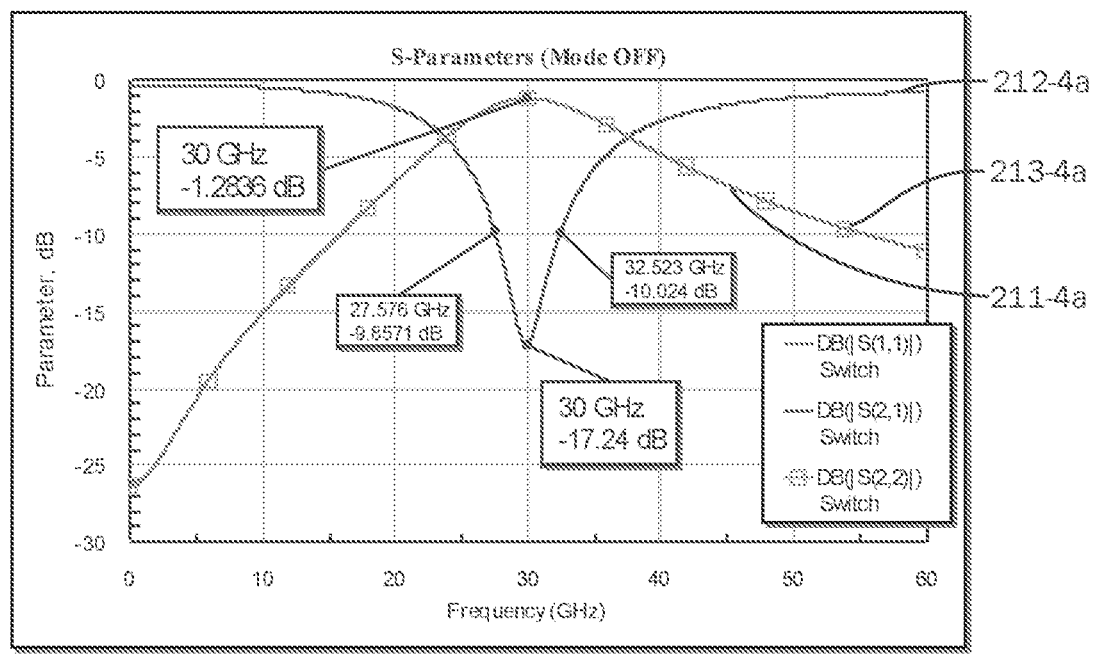
FIG. 19B is a graph plotting a sweep of simulated S-parameters over a frequency range for the second embodiment of the switch with a 5 Ohm metallic trace loss associated with each inductor turn and the second set of transistor parameters, when switched off.
Figure 20A:
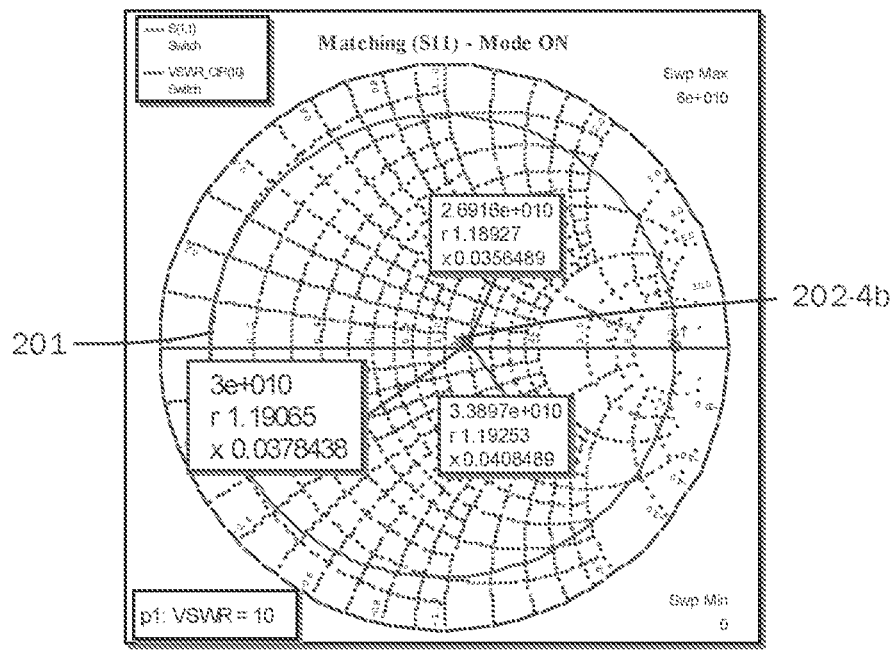
Figure 20B:
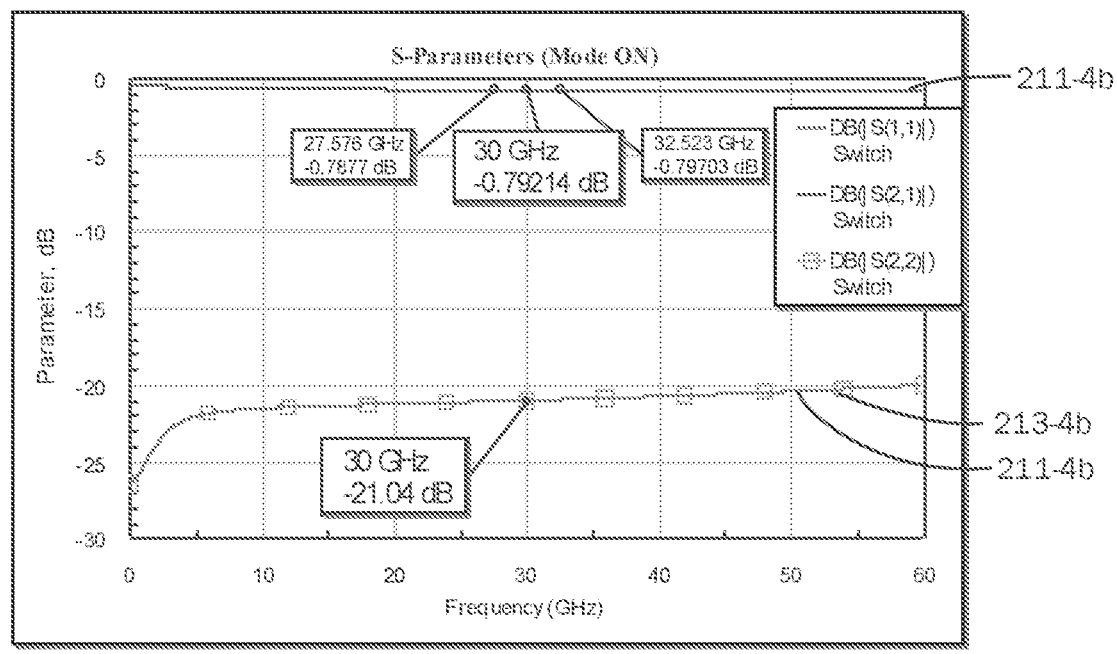

The Smith charts of FIGS. 19A and 20A plot the simulated input reflection coefficients (S11) of the second embodiment of the resonant switch 10b discussed above, in the off/deactivated state and the on/activated state, respectively. The graphs of FIGS. 19B and 20B plot the simulated scattering parameters (S-parameters) of the second embodiment of the resonant switch 10b in the off/deactivated state and the on/activated state, respectively. In this simulation, the metallic trace loss has been doubled as has the transistor size. Accordingly, the metallic trace loss is set to 5 Ohm per turn, and the on-mode resistance RSW is reduced to 5 Ohm, while the resistance component of the off-mode capacitance CSW is reduced to 15 Ohm (while maintaining the capacitive component to 20 fF). As indicated above, this configuration of the transistor may be referred to as the second set of transistor parameters.

The center inductor L2, the first peripheral inductor L1, and the second peripheral inductor L2 each have their inductance values set to 250 pH. The Q of each of these inductors is 19, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 80 fF with a resistive component of 0.2 Ohm.

In both FIGS. 19A and 20A, the first plot 201 represents a reference vertical standing wave ratio (VSWR) of 10:1. In FIG. 19A, the second plot 202-4a is of the input reflection coefficient S11 of the resonant switch 10a in the off/deactivated state. In FIG. 10A, the second plot 202-4b is for the on/activated state.

In the graph of FIG. 19B, first plot 211-4a is of the first port reflection coefficient S11, a second plot 212-4a is of the insertion loss S21, and the third plot 213-4a is of the second port reflection coefficient S22, all of which are for the second embodiment of the resonant switch 10b being in the off/deactivated state as simulated with the above-described parameter values. In FIG. 19B, a first plot 211-4b is of the first port reflection coefficient S11, a second plot 212-4b is of the insertion loss S21, and the third plot 213-4b is of the second port reflection coefficient S22, all of which are for the first embodiment of the resonant switch 10b being in the on/activated state as simulated with the above-described parameter values.

Figure 21A:
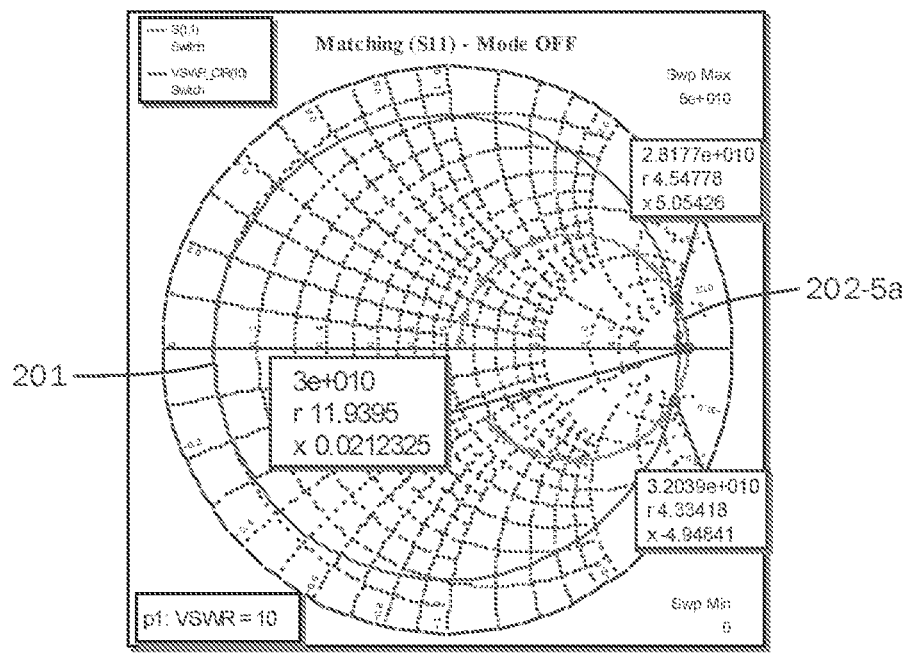
FIG. 21A is a Smith chart plotting the simulated input reflection coefficients (S11) of the second embodiment of the switch with a 5 Ohm metallic trace loss associated with each inductor turn and the first set of transistor parameters, when switched off.
Figure 21B:
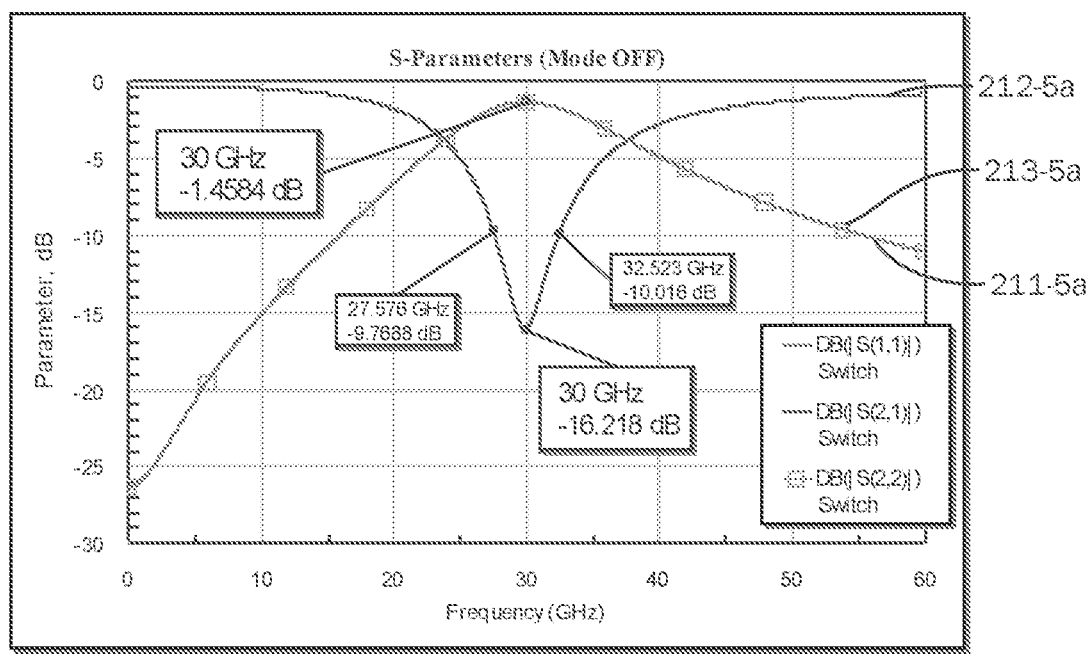
FIG. 21B is a graph plotting a sweep of simulated S-parameters over a frequency range for the second embodiment of the switch with a 5 Ohm metallic trace loss associated with each inductor turn and the first set of transistor parameters, when switched off.
Figure 22A:
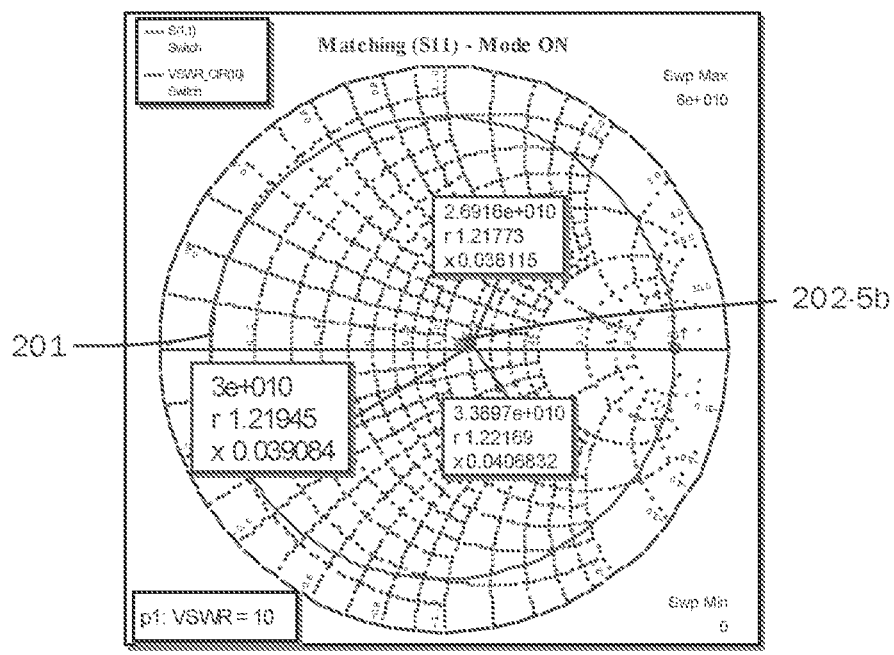
Figure 22B:
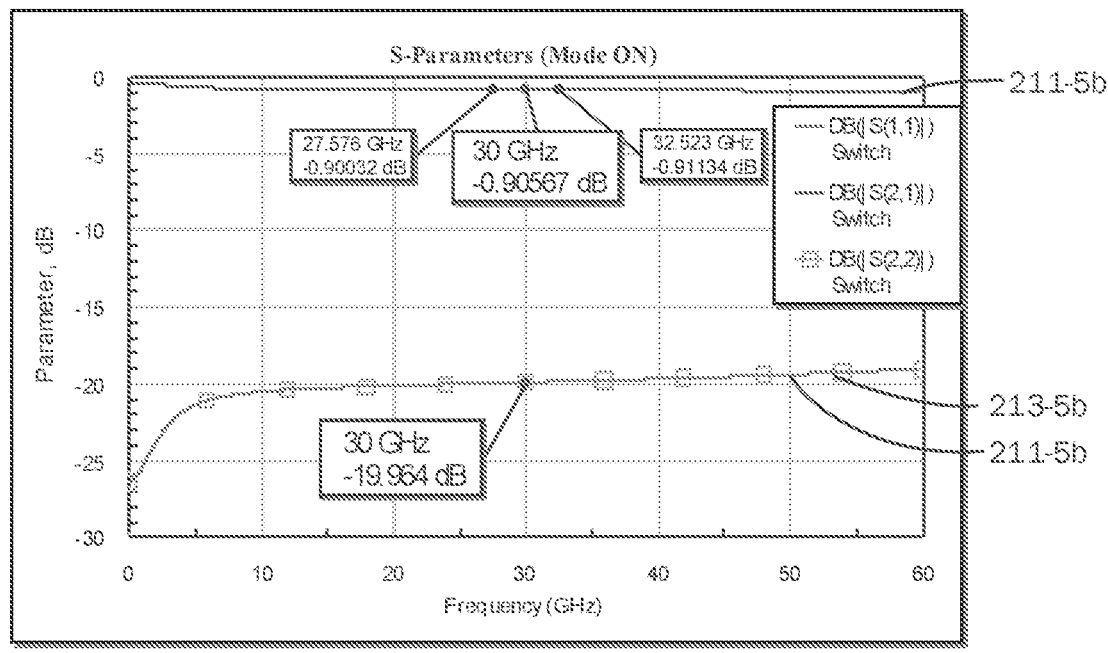

The Smith charts of FIGS. 21A and 22A plot the simulated input reflection coefficients (S11) of the second embodiment of the resonant switch 10b discussed above, in the off/deactivated state and the on/activated state, respectively. In both figures, the first plot 201 represents a reference vertical standing wave ratio (VSWR) of 10:1. In FIG. 21A, the second plot 202-5a is of the input reflection coefficient S11 of the resonant switch 10b in the off/deactivated state. In FIG. 22A, the second plot 202-5b is for the on/activated state. The graphs of FIGS. 21B and 22B plot the simulated scattering parameters (S-parameters) of the second embodiment of the resonant switch 10b in the off/deactivated state and the on/activated state, respectively. Specifically, in FIG. 21B, a first plot 211-5a is of the first port reflection coefficient S11, a second plot 212-5a is of the insertion loss S21, and the third plot 213-5a is of the second port reflection coefficient S22, all of which are for the second embodiment of the resonant switch 10b being in the off/deactivated state. In FIG. 22B, a first plot 211-5b is of the first port reflection coefficient S11, a second plot 212-5b is of the insertion loss S21, and the third plot 213-5b is of the second port reflection coefficient S22, all of which are for the second embodiment of the resonant switch 10b being in the on/activated state.

In this simulation, the center inductor L2, the first peripheral inductor L1, and the second peripheral inductor L2 each have an inductance value of 250 pH, as well as a resistance of 5 Ohm per turn. The Q of each of these inductors is 9.5, and the coupling factor of the first peripheral inductor L1 and the center inductor L2 (e.g., K1_2, as well as the coupling factor of the center inductor L2 and the second peripheral inductor L3 (e.g., K2_3) is 0.9. The coupling factor of the first peripheral inductor L1 and the second peripheral inductor L3 is set to 0.7. The capacitor 22 that defines the parallel resonance with the center inductor L2 is set to 46 fF with a resistive component of 0.2 Ohm. The aforementioned first set of transistor parameters, defined by the switching resistance RSW in the on mode as 10 Ohm, and the switching capacitance CSW in the off mode as 20 fF with a resistive component of 20 Ohm, was utilized for this simulation. Although the metallic trace loss and the transistor size were doubled, insertion loss increased by less than 0.1 dB over other simulation parameters and yielded an overall loss of approximately 0.9 dB. Again, this is contemplated to achieve the performance objectives of the resonant switch 10 of the present disclosure.

Figure 23:
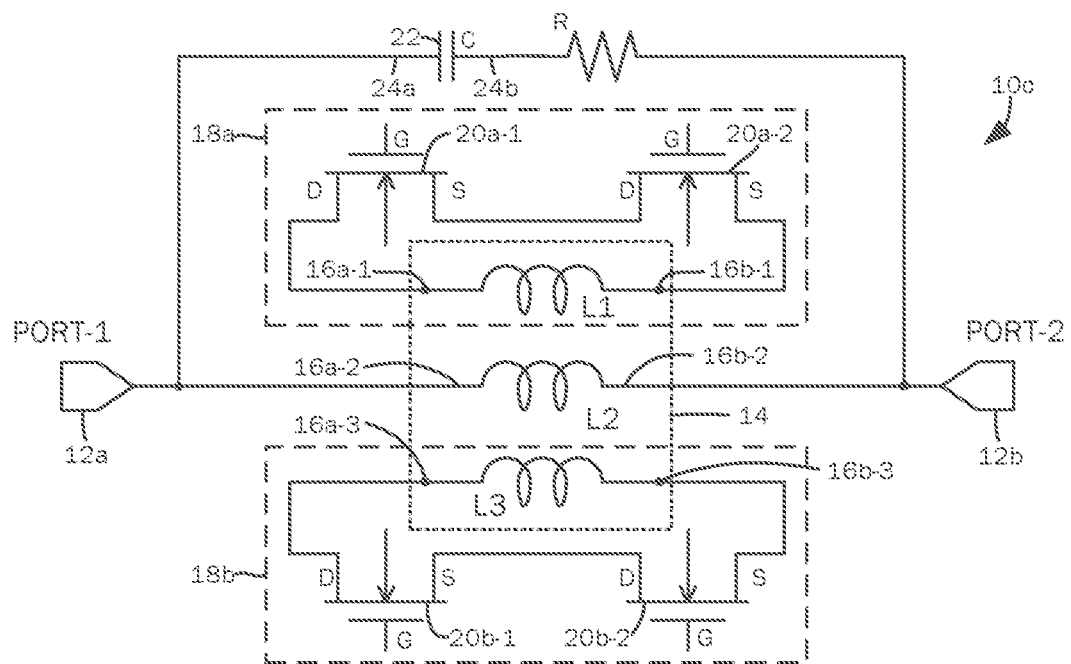
FIG. 23 is a schematic diagram of an exemplary low-loss mmWave resonant switch in accordance with a third embodiment of the present disclosure.
Figure 24:
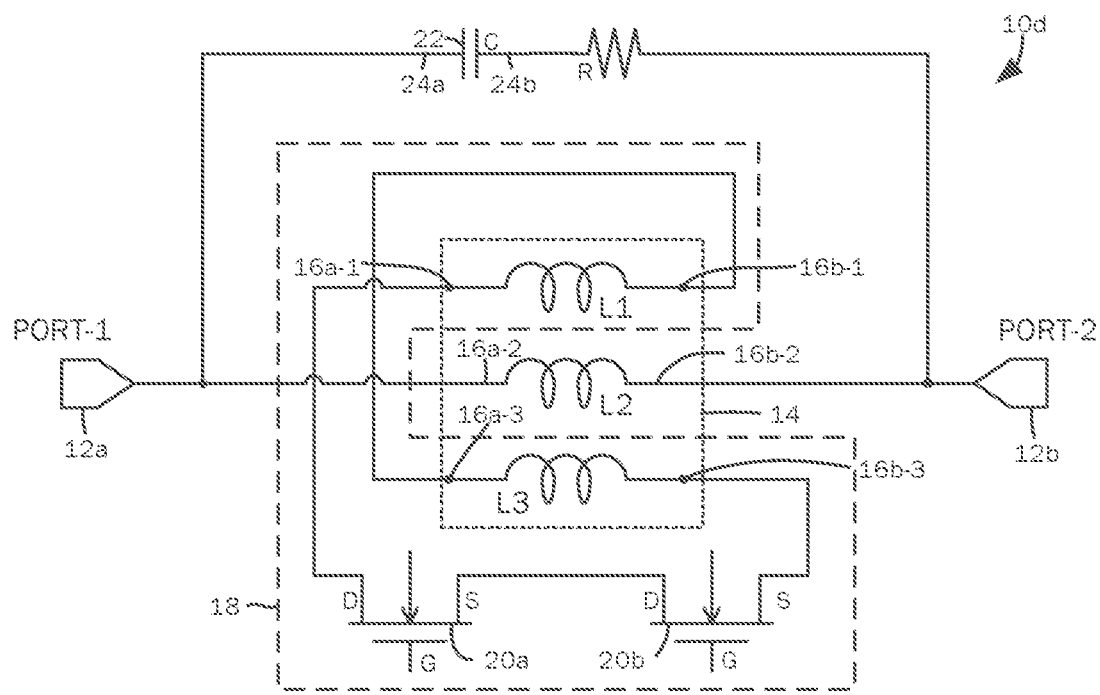
FIG. 24 is a schematic diagram of an exemplary low-loss mmWave resonant switch in accordance with a fourth embodiment of the present disclosure.

The schematic diagram of FIG. 23 depicts a third embodiment of a resonant switch 10c, which again includes the first port 12a and the second port 12b to which various other circuit components may be connected. The third embodiment 10c incorporates the same triple inductor network 14 comprised of the center inductor L2, the first peripheral inductor L1, and the second peripheral inductor L3. As will be described in further detail below, two transistors are utilized in each of the two transistor switches 18. The incorporation of two transistor switches 18 is the same as the first embodiment of the resonant switch 10a. This is envisioned to increase the operating power levels of the resonant switch 10 without introducing unnecessary non-linear signal components.

The center inductor L2 is defined by the first terminal 16a-2 that is electrically connected to the first port 12a, and a second terminal 16b-2 that is electrically connected to the second port 12b. The first peripheral inductor L1 likewise has a first terminal 16a-1 and a second terminal 16b-1, while the second peripheral inductor L2 has a first terminal 16a-3 and a second terminal 16b-3. In one embodiment, the inductors L1, L2, and L3 may be implemented as a series of metallic traces on the semiconductor die and routed to define one or more turns that are spaced apart from each other and electromagnetically coupled.

The peripheral inductors a part of transistor switches 18 that are a constituent element of the resonant switch 10. There is a first transistor switch 18a that incorporates the first peripheral inductor L1, and a second transistor switch 18b that incorporates the second peripheral inductor L3. In one embodiment, the first transistor switch 18a has first transistor 20a-1 and a second transistor 20a-2 that are connected in series, and the second transistor switch 18b has a first transistor 20b-1 and a second transistor 20b-2 that are similarly connected in series. In the illustrated third embodiment of the resonant switch 10c, the transistors 20 are contemplated to be field effect transistors that have a gate terminal, a drain terminal, and a source terminal. The specific fabrication technology need not be limited to metal oxide semiconductor as shown, and any other suitable transistor type may be substituted in the transistor switches 18.

In the first transistor switch 18a, the drain terminal of the first transistor 20a-1 is connected to the first terminal 16a-1 of the first peripheral inductor L1. The source terminal of the first transistor 20a-1 is connected to the drain terminal of the second transistor 20a-2. The source terminal of the second transistor 20a-2, in turn, is connected to the second terminal 16b-1 of the first peripheral inductor L1. Similarly, in the second transistor switch 18b, the drain terminal for the first transistor 20b-1 thereof is connected to the first terminal 16a-3 of the second peripheral inductor L3, and the source terminal of the first transistor 20b-1 is connected to the drain terminal of the second transistor 20b-2. Additional transistors 20 connected in series in the transistor switch 18 are envisioned to further increase the operating power levels of the resonant switch 10. The source terminal of the second transistor 20b-2 is connected to the second terminal 16b-3 of the second peripheral inductor L3. The gate terminals of each of the transistors in the first transistor switch 18a, i.e., the first transistor 20a-1 and second transistor 20b-2, and those in the second transistor switch 18b, i.e., the first transistor 20b-1 and the second transistor 20b-2, may be connected to a control signal source that can either drive the gate high or low (on or off).

The third embodiment of the resonant switch 10c includes the capacitor 22 that is connected in parallel to the triple inductor network 14. The capacitor 22 may have a first terminal 24a that is connected to the first port 12a, along with a second terminal 24b that is connected to the second port 12b. The capacitor 22 and the connection to the other segments of the resonant switch 10a may also have an associated parasitic resistance R that is shown in series with the capacitor 22. The capacitor 22 and the center inductor L3 are understood to define a parallel resonance at a predefined operating frequency range when the resonant switch 10a is in the off or deactivated mode. When the resonant switch 10c is in the on or activated mode, the first transistor switch 18a and the second transistor switch 18b, that is, the first transistor 20a-1 and the second transistor 20a-2 of the first transistor switch 18a and the second transistor 20b-1 and the second transistor 20b-2 of the second transistor switch 18b, are likewise activated or turned on. The transistors 20 are so activated/turned on when the gate voltage is set high. In this state, the transistors 20 define a low series resistance.

The operating principles of the third embodiment of the resonant switch 10c are otherwise the same as the other embodiments described above and will not be repeated for the sake of brevity. The addition of the second transistor for each transistor switch 18a, 18b is understood to enable higher operating power levels.

The schematic diagram of FIG. 23 shows a fourth embodiment of a resonant switch 10d, which again includes the first port 12a and the second port 12b to which various other circuit components may be connected. Generally, the fourth embodiment 10b incorporates the same triple inductor network 14 comprised of the center inductor L2, the first peripheral inductor L1, and the second peripheral inductor L3. Only a single transistor switch 18 is utilized, but two transistors 20 in series are incorporated therein.

The center inductor L2 is defined by the first terminal 16a-2 that is electrically connected to the first port 12a, and a second terminal 16b-2 that is electrically connected to the second port 12b. The first peripheral inductor L1 likewise has a first terminal 16a-1 and a second terminal 16b-1, while the second peripheral inductor L2 has a first terminal 16a-3 and a second terminal 16b-3. As was the case with the other embodiments, the inductors L1, L2, and L3 may be implemented as a series of metallic traces on the semiconductor die and routed to define one or more turns that are spaced apart from each other and electromagnetically coupled.

The peripheral inductors L1, L3 are a part of the one transistor switch 18 that is a constituent element of the resonant switch 10. In the illustrated embodiment, the transistor switch 18 has two transistors: a first transistor 20a and a second transistor 20b. In the fourth embodiment of the resonant switch 10d, the transistors 20 are contemplated to be field effect transistors that each have a gate terminal, a drain terminal, and a source terminal. The specifics of the transistor illustrated in the figures is presented by way of example only and not of limitation, and any other suitable transistor structure, fabricated in any manner, may be substituted without departing from the scope of the present disclosure.

In the transistor switch 18, the drain terminal of the first transistor 20a is connected to the first terminal 16a-1 of the first peripheral inductor L1. The source terminal of the first transistor 20a is connected to the drain terminal of the second transistor 20b, and thus the first transistor 20a is connected in series with the second transistor 20b. Incorporating the two transistors 20a, 20b is contemplated to increase the power handling characteristics of the resonant switch 10d without creating unnecessary non-linear signal components. Additional transistors 20 connected in series in the transistor switch 18 are envisioned to further increase the operating power levels of the resonant switch 10. The source terminal of the second transistor 20b is connected to the second terminal 16b-3 of the second peripheral indictor L2. The first terminal 16a-3 of the second peripheral inductor, in turn, is connected to the second terminal 16b-2 of the first peripheral inductor L1. The gate terminals of the transistors 20a, 20b may be connected to a control signal source that can either drive the gate high or low (on or off).

The fourth embodiment of the resonant switch 10b likewise includes the capacitor 22 that is connected in parallel to the triple inductor network 14. The capacitor 22 includes the first terminal 24a that is connected to the first port 12a, along with a second terminal 24b that is connected to the second port 12b. The capacitor 22 and the connection to the other segments of the resonant switch 10b may also have an associated parasitic resistance R that is shown in series with the capacitor 22.

The capacitor 22 and the center inductor L3 may define a parallel resonance at a predefined operating frequency range when the resonant switch 10d is in the off or deactivated mode. Such off/deactivated mode is set when the transistor switch 18, and specifically the transistors 20a, 20b thereof, is deactivated or turned off. The transistors 20 are so deactivated/turned off when the gate voltage is set low. When the resonant switch 10d is in the on or activated mode, the transistor switch 18, that is, the first transistor 20a and the second transistor 20b, are likewise activated or turned on. The transistors 20a, 20b are so activated/turned on when the gate voltage is set high. In this state, the transistors 20 define a low series resistance. The operating principles of the fourth embodiment of the resonant switch 10d are otherwise the same as the other embodiments described above and will not be repeated for the sake of brevity.

Figure 25:
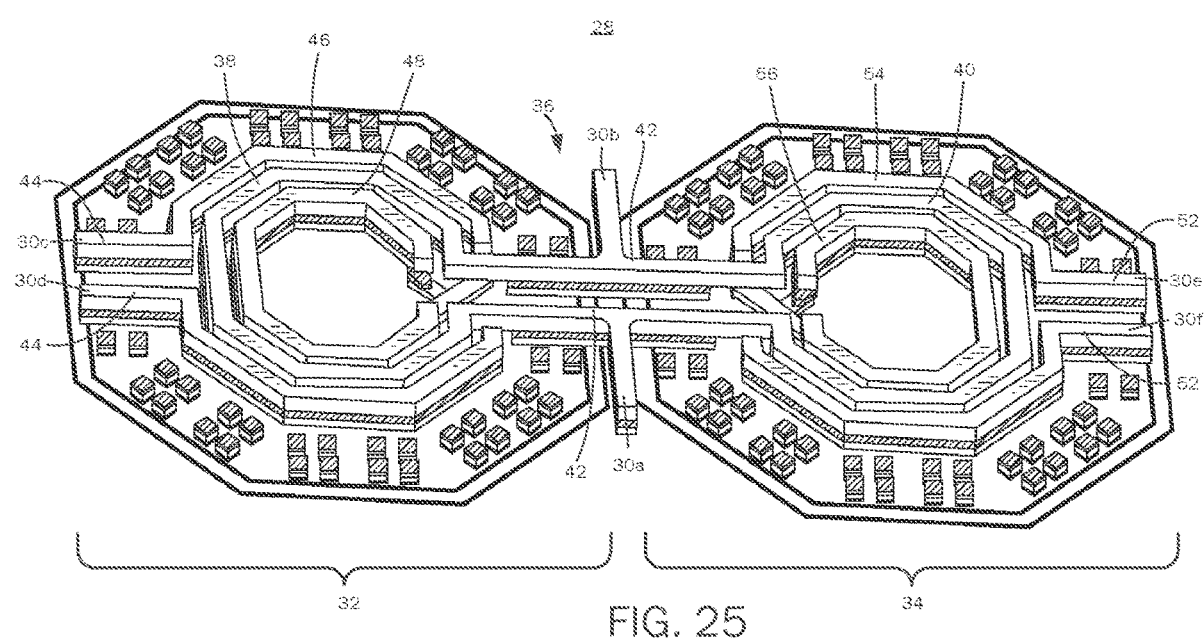
FIG. 25 is a top perspective view of a physical implementation of the low-loss mmWave resonant switch.
Figure 26:
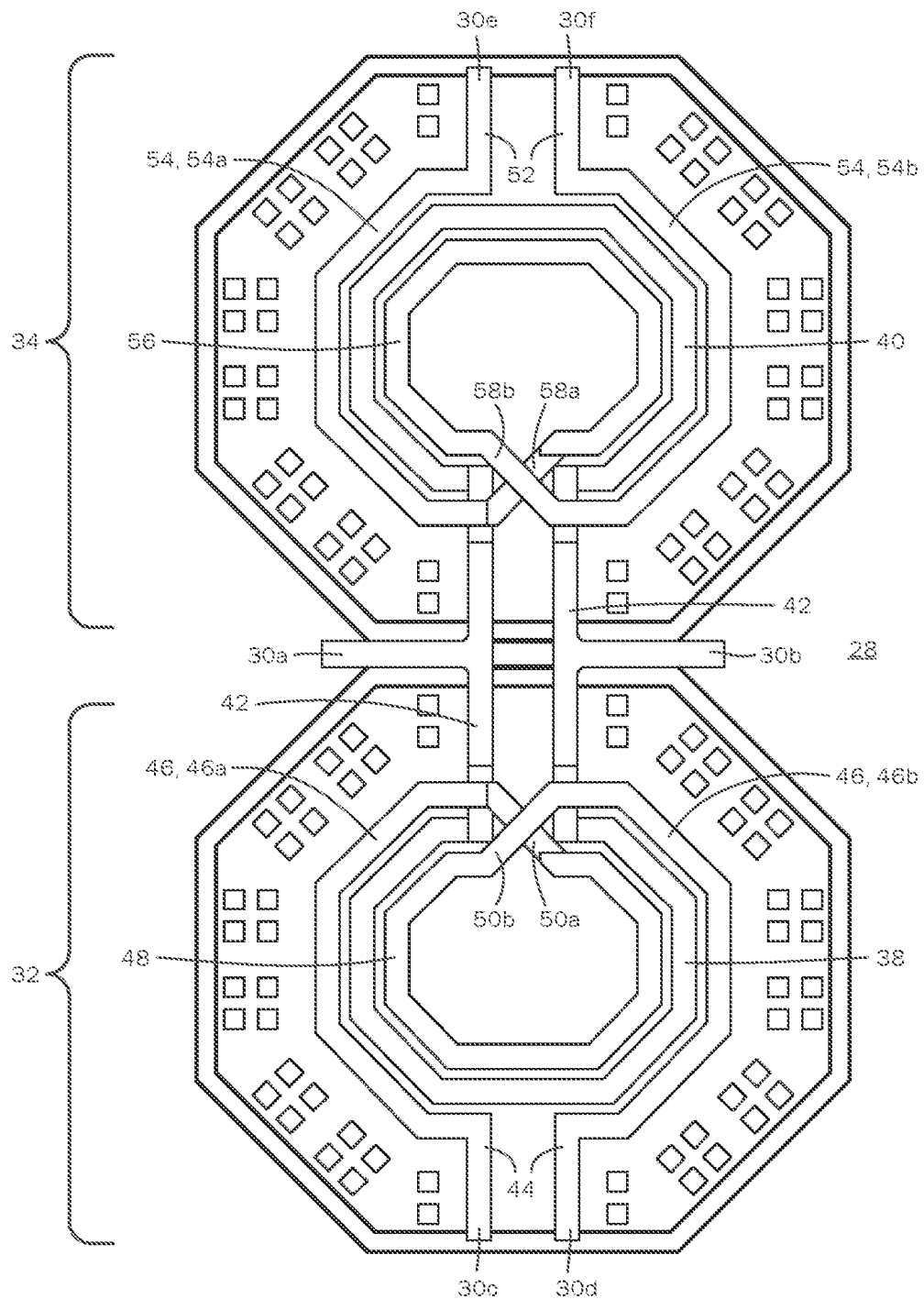
FIG. 26 is a bottom plan view of the low-loss mmWave resonant switch.

FIGS. 25 and 26 illustrate one physical embodiment of a single pole, dual pole (SP2T) RF resonant switch 28 in accordance with the present disclosure and based on two SP1T switches having a common connection point. The resonant switch 28 may be fabricated with a bulk CMOS (Complementary Metal Oxide Semiconductor) process, which is contemplated to contribute to the reduction of insertion loss at mmWave frequencies. The resonant switch 28 may have first port 30a and a second port 30b that generally corresponds to an RF signal input port and an RF signal output port, respectively, as well as the first port 12a and the second port 12b noted above. Structurally, the resonant switch is characterized by a left loop side 32 and a right loop side 34, bisected by a center region 36. The first port 30a and the second port 30b are located in the center region 36, with conductive traces extending toward each loop side 32, 34. Specifically, the first port 30a and the second port 30b are electrically and mechanically contiguous, with both extending to a left center loop 38 and a right center loop 40. The conductive metallic trace 42 comprising the left center loop 38 and the right center loop 40 are understood to correspond to the center inductor L2.

The left loop side 32 includes an additional conductive metallic trace 44 with one end corresponding to a third port 30c and another end corresponding to a fourth port 30d, both of which may be connected to a first one of the transistors. The third port 30c and the fourth port 30d may be designated for a transmit switch transistor, though this is for exemplary purposes only. Between the third port 30c and the fourth port 3d, the conductive metallic trace 44 defines an outer peripheral loop 46 and an inner peripheral loop 48, both of which are electrically contiguous. The outer peripheral loop 46 may be further segregated into a first segment 46a and a second segment 46b. The first segment 46a is structurally contiguous with the third port 30c and is connected to the inner peripheral loop 48 via a first crossover jumper 50a. At the end opposite the connection to the first crossover jumper 50a, the inner peripheral loop 48 is connected to a second crossover jumper 50b to the second segment 46b of the outer peripheral loop 46. The outer and inner peripheral loops 46, 48 are spaced apart from the left center loop 38, and therefore are not electrically connected. However, it is understood that such peripheral loops 46, 48 are electromagnetically coupled to the left center loop 38. In this regard, peripheral loops 46, 48 are understood to correspond to the first peripheral inductor L1 discussed above.

The right loop side 34 has a similar configuration, with a separate conductive metallic trace 52 with one end corresponding to a fifth port 30e and another end corresponding to a sixth port 30f, both of which may be connected to a second one of the transistors. The fifth port 30e and the sixth port 30f may be designated for a receive switch transistor, though this again is for exemplary purposes only. Between the fifth port 30e and the sixth port 30f, the conductive metallic trace 52 defines an outer peripheral loop 54 and an inner peripheral loop 56, both of which are electrically contiguous. The outer peripheral loop 54 may be further segregated into a first segment 54a and a second segment 54b. The first segment 54a is structurally contiguous with the fifth port 30e and is connected to the inner peripheral loop 48 via a first crossover jumper 58a. At the end opposite the connection to the first crossover jumper 58a, the inner peripheral loop 56 is connected to a second crossover jumper 58b to the second segment 54b of the outer peripheral loop 54. The outer and inner peripheral loops 54, 56 are spaced apart from the right center loop 40, and therefore are not electrically connected, though such peripheral loops 54, 56 are electromagnetically coupled to the right center loop 40. In this regard, peripheral loops 54, 56 are understood to correspond to the second peripheral inductor L3 discussed above.

The resonant switch 10 in accordance with the embodiments of the present disclosure may be configured as stand-alone devices or utilized in conjunction with a variety of other circuits. Furthermore, although the embodiments of the resonant switch 10 in which the underlying fabrication modality is CMOS, any other fabrication modality or technology node may be utilized without departing from the scope of the present disclosure. The embodiments of the resonant switch 10 have been described as being suitable for mmWave operating frequencies, but it will be appreciated by those having ordinary skill in the art that other embodiments that may be suitable for lower operating frequencies are also possible, and within the contemplation of the present disclosure.

The particulars shown herein are by way of example and for purposes of illustrative discussion of the embodiments of the present disclosure only and are presented in the cause of providing what is believed to be the most useful and readily understood description of the principles and conceptual aspects of the present disclosure. In this regard, no attempt is made to show details of these embodiments with more particularity than is necessary for the fundamental understanding of the present disclosure, the description taken with the drawings making apparent to those skilled in the art how the several forms of the present disclosure may be embodied in practice.

What is claimed is:

1. A resonant switch with a first port and a second port, comprising:
    a center inductor electrically connected to the first port and the second port;
    a first peripheral inductor electromagnetically coupled to the center inductor;
    a first switching transistor network electrically connected to the first peripheral inductor;
    a second peripheral inductor electromagnetically coupled to the center inductor;
    a second switching transistor network electrically connected to the second peripheral inductor; and
    a parallel capacitor connected to the first port and the second port and tuned to resonate with the center inductor at a predefined operating frequency range and isolate the first port from the second port with the first switching transistor network and the second switching transistor network being deactivated.

2. The resonant switch of claim 1, wherein magnetic flux in the center inductor is cancelled by opposing magnetic fluxes from the first peripheral inductor and the second peripheral inductor with the first switching transistor network and the second switching transistor network being activated.

3. The resonant switch of claim 2, wherein overall insertion loss in an activated state is defined in substantial part by resistive losses associated with metallic traces of the center inductor.

4. The resonant switch of claim 1, wherein the first switching transistor network is a single transistor and the second switching transistor network is a single transistor.

5. The resonant switch of claim 4, wherein the transistors are a field effect type having a gate, a source, and a drain, the respective one of the first and second peripheral inductors being connected across the corresponding source and drain of the transistors.

6. The resonant switch of claim 5, wherein the activation and the deactivation of the first and second switching transistor networks is controlled by the gates of the constituent transistors thereof.

7. The resonant switch of claim 1, wherein:
    the first switching transistor network includes a first transistor and a second transistor connected in series; and
    the second switching transistor network includes a third transistor and a fourth transistor connected in series.

8. A resonant switch with a first port and a second port, comprising:
    a center inductor electrically connected to the first port and the second port;
    a first peripheral inductor electromagnetically coupled to the center inductor;
    a second peripheral inductor electromagnetically coupled to the center inductor;
    a switching transistor electrically connected to the first peripheral inductor and the second peripheral inductor; and
    a parallel capacitor connected to the first port and the second port and tuned to resonate with the center inductor at a predefined operating frequency range and isolate the first port from the second port with the switching transistor being deactivated.

9. The resonant switch of claim 8, wherein magnetic flux in the center inductor is cancelled by opposing magnetic fluxes from the first peripheral inductor and the second peripheral inductor with the switching transistor network being activated.

10. The resonant switch of claim 8, wherein the switching transistor network is a single transistor.

11. The resonant switch of claim 10, wherein the transistor is a field effect type having a gate, a source, and a drain, the first peripheral inductor being connected to the source, the second peripheral inductor being connected to the drain, and the first peripheral inductor and the second peripheral inductor being connected in series with each other.

12. The resonant switch of claim 10, wherein the activation and the deactivation of the switching transistor network is controlled by the gate of the constituent transistor thereof.

13. The resonant switch of claim 8, wherein the switching transistor network is a first transistor and a second transistor connected in series.

14. The resonant switch of claim 13, wherein the first and second transistors are a field effect type having a gate, a source, and a drain, the first peripheral inductor being connected to the source of the first transistor, the second peripheral inductor being connected to the drain of the second transistor, the drain of the first transistor being connected to the source of the second transistor, and the first peripheral inductor and the second peripheral inductor being connected in series with each other.

15. The resonant switch of claim 10, wherein the activation and the deactivation of the switching transistor network is controlled by the gate of the constituent first and second transistors thereof.

16. The resonant switch of claim 8, wherein overall insertion loss in an activated state is defined in substantial part by resistive losses associated with metallic traces of the center inductor.

17. A resonant switch with a first port and a second port, comprising:
    a capacitor connected to the first port and the second port;
    a triple inductor network including a center inductor connected to the first port and the second port, and first and second peripheral inductors each electromagnetically coupled thereto, in a deactivated state, the center inductor and the capacitor defining a parallel resonance at a predefined operating frequency range, and in an activated state, insertion loss associated with the center inductor being substantially minimized to metallic trace loss attributable thereto.

18. The resonant switch of claim 17, further comprising:
    one or more transistor switches connected to the first and second peripheral inductors, in the activated state, the first and second peripheral inductors generating a magnetic flux that cancels magnetic flux of the center inductor.

19. The resonant switch of claim 18, wherein the transistor switches define a high impedance across the first peripheral inductor and the second peripheral inductor in the deactivated state.

20. The resonant switch of claim 19, wherein the parallel resonance isolates the first port from the second port.

* * * * *